(12) United States Patent
Kotou

(10) Patent No.: US 12,334,437 B2
(45) Date of Patent: Jun. 17, 2025

(54) SEMICONDUCTOR STORAGE DEVICE AND METHOD FOR MANUFACTURING SEMICONDUCTOR STORAGE DEVICE

(71) Applicant: KIOXIA CORPORATION, Tokyo (JP)

(72) Inventor: Takahiro Kotou, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 508 days.

(21) Appl. No.: 17/679,866

(22) Filed: Feb. 24, 2022

(65) Prior Publication Data

US 2023/0071758 A1    Mar. 9, 2023

(30) Foreign Application Priority Data

Sep. 8, 2021 (JP) ................................. 2021-146467

(51) Int. Cl.
*H01L 23/528* (2006.01)
*H10B 43/27* (2023.01)

(52) U.S. Cl.
CPC ........... *H01L 23/528* (2013.01); *H10B 43/27* (2023.02)

(58) Field of Classification Search
CPC ............................. H10B 43/27; H01L 23/528
See application file for complete search history.

(56) References Cited

U.S. PATENT DOCUMENTS

| | | | |
|---|---|---|---|
| 2013/0228842 A1* | 9/2013 | Kotou | ............... H01L 29/42336 438/587 |
| 2020/0295020 A1 | 9/2020 | Mori | |
| 2020/0402999 A1 | 12/2020 | Nakaki | |
| 2024/0292620 A1* | 8/2024 | Kotou | ..................... H10B 43/50 |

FOREIGN PATENT DOCUMENTS

JP           2020-205387 A       12/2020

* cited by examiner

*Primary Examiner* — Richard A Booth
(74) *Attorney, Agent, or Firm* — Kim & Stewart LLP

(57) ABSTRACT

A semiconductor storage device includes a plurality of wiring layers stacked in a first direction, a memory pillar penetrating the plurality of wiring layers in the first direction, and a semiconductor layer provided in the memory pillar and extending in the first direction. The semiconductor storage device further includes a wiring layer that extends in a second direction crossing the first direction, is provided above the plurality of wiring layers, and penetrates the semiconductor layer.

12 Claims, 21 Drawing Sheets

SEMICONDUCTOR STORAGE DEVICE AND METHOD FOR MANUFACTURING SEMICONDUCTOR STORAGE DEVICE

CROSS-REFERENCE TO RELATED APPLICATION

This application is based upon and claims the benefit of priority from Japanese Patent Application No. 2021-146467, filed Sep. 8, 2021, the entire contents of which are incorporated herein by reference.

FIELD

Embodiments described herein relate generally to a semiconductor storage device and a method for manufacturing a semiconductor storage device.

BACKGROUND

A NAND flash memory is known as a semiconductor storage device.

DETAILED DESCRIPTION

Embodiments provide a semiconductor storage device and a method for manufacturing a semiconductor storage device, which can prevent an increase in a chip area and prevent an increase in channel resistance of a memory string.

In general, according to one embodiment, a semiconductor storage device includes a plurality of first wirings stacked in a first direction, a memory pillar penetrating the plurality of first wirings in the first direction, and a semiconductor layer provided in the memory pillar and extending in the first direction. The semiconductor storage device further includes a second wiring that is provided above the plurality of first wirings in the first direction, extends in a second direction crossing the first direction, and penetrates the semiconductor layer.

Hereinafter, the embodiments will be described with reference to drawings.

(1. Configuration)

(1-1. Configuration of Memory System)

Figure 1:
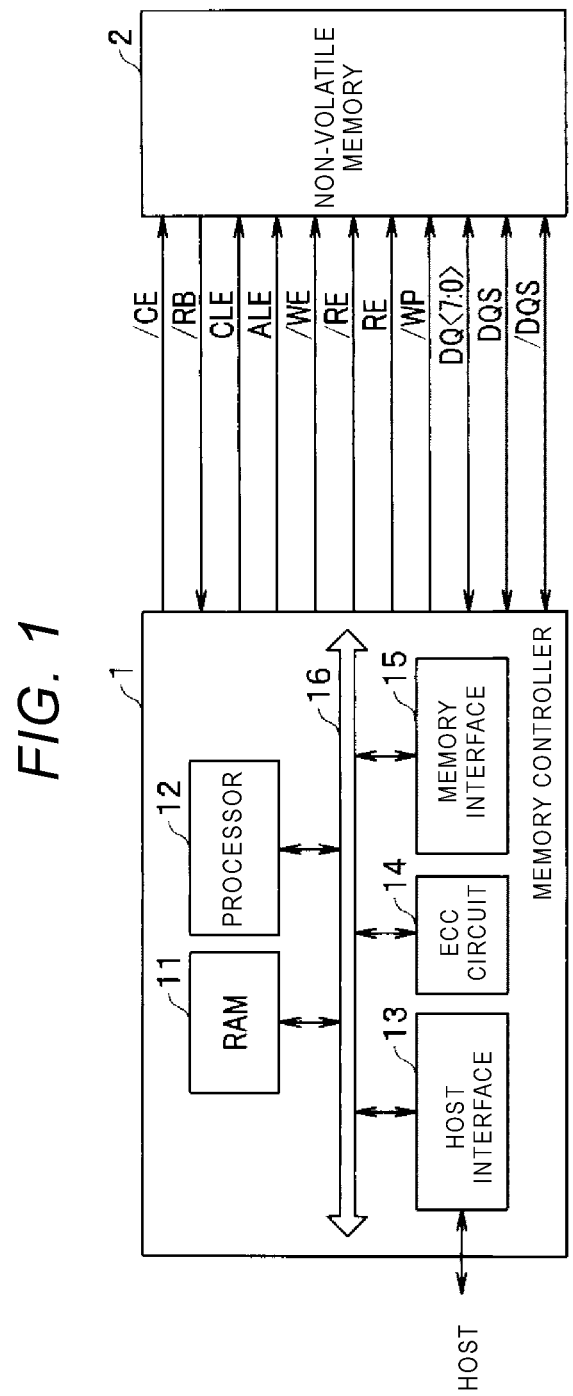
FIG. 1 is a block diagram illustrating a configuration example of a memory system using a semiconductor storage device according to an embodiment.

FIG. 1 is a block diagram illustrating a configuration example of a memory system using a semiconductor storage device according to the embodiment. The memory system of the embodiment includes a memory controller 1 and a non-volatile memory 2 as a semiconductor storage device. The memory system can be connected to a host. The host is, for example, an electronic device such as a personal computer or a mobile terminal.

The non-volatile memory 2 is a memory that stores data in a non-volatile manner, and includes, for example, a NAND memory (e.g., NAND flash memory). The non-volatile memory 2 is, for example, a NAND memory having a memory cell capable of storing 3 bits per memory cell, that is, a NAND memory of 3 bits/Cell (TLC: Triple Level Cell). Further, the non-volatile memory 2 may be a NAND memory capable of storing a plurality of bits of 1 bit/Cell, 2 bits/Cell, or 4 bits/Cell or more. In addition, the non-volatile memory 2 usually includes a plurality of memory chips.

The memory controller 1 controls data writing to the non-volatile memory 2 according to a write request from the host. In addition, the memory controller 1 controls data reading from the non-volatile memory 2 according to a read request from the host. Signals such as a chip enable signal /CE, a ready busy signal /RB, a command latch enable signal CLE, an address latch enable signal ALE, a write enable signal /WE, read enable signals RE and /RE, a write protect signal /WP, a signal DQ <7: 0> containing data, and data strobe signals DQS and /DQS are transmitted and received between the memory controller 1 and the non-volatile memory 2. Further, "/" appended to a signal name indicates that a signal is low active.

Each of the non-volatile memory 2 and the memory controller 1 is formed, for example, as a semiconductor chip (hereinafter, also simply referred to as a "chip").

The chip enable signal /CE is a signal for selecting and enabling a specific memory chip of the non-volatile memory 2. The ready busy signal /RB is a signal for indicating whether the non-volatile memory 2 is in a ready state (a state in which an external command can be received) or a busy state (a state in which an external command cannot be received). The memory controller 1 can determine the state of the non-volatile memory 2 from the signal /RB. The command latch enable signal CLE is a signal indicating that the signal DQ <7: 0> contains a command. The command latch enable signal CLE enables the command transmitted as the signal DQ to be latched in a command register in the selected memory chip of the non-volatile memory 2. The address latch enable signal ALE is a signal indicating that the signal DQ <7: 0> contains an address. The address latch enable signal ALE enables the address transmitted as the signal DQ to be latched in an address register in the selected memory chip of the non-volatile memory 2. The write enable signal /WE is a signal for writing the signal DQ <7: 0> into the non-volatile memory 2, and is asserted each time a command, an address, and data are received by the memory controller 1. While the signal /WE is at a "L (Low)" level, the non-volatile memory 2 is instructed to take in the signal DQ <7: 0>.

The read enable signals RE and /RE are signals for the memory controller 1 to read the data from the non-volatile memory 2. For example, the read enable signals RE and /RE are used to control an operation timing of the non-volatile memory 2 when the signal DQ <7: 0> is output from the non-volatile memory 2. The write protect signal /WP is a signal for instructing the non-volatile memory 2 to prohibit data writing and data erasing. The signal DQ <7: 0> is the data signal transmitted and received between the non-volatile memory 2 and the memory controller 1, and includes a command, an address, and data. The data strobe signals DQS and /DQS are signals for controlling an input timing and an output timing of the signal DQ <7: 0>.

The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other by an internal bus 16.

The host interface 13 outputs a request, user data to be written in the non-volatile memory, and the like that are received from the host to the internal bus 16. In addition, the host interface 13 transmits user data read from the non-volatile memory 2, a response from the processor 12, and the like to the host.

The memory interface 15 controls a process of writing the user data or the like to the non-volatile memory 2 and a process of reading the user data or the like from the non-volatile memory 2 based on an instruction of the processor 12.

The processor 12 controls the memory controller 1. The processor 12 is, for example, a central processing unit (CPU), a micro processing unit (MPU), and the like. When the processor 12 receives the request from the host via the host interface 13, the processor 12 performs control according to the request. For example, the processor 12 instructs the memory interface 15 to write the user data and parity to the non-volatile memory 2 in response to the request from the host. In addition, the processor 12 instructs the memory interface 15 to read the user data and the parity from the non-volatile memory 2 in response to the request from the host.

The processor 12 determines a storage region (memory region) on the non-volatile memory 2 with respect to user data stored in the RAM 11. The user data is stored in the RAM 11 via the internal bus 16. The processor 12 determines the memory region for data in units of pages (page data), which are units of reading and writing. In the present specification, user data stored in one page of the non-volatile memory 2 is defined as unit data. The unit data is generally encoded by the ECC circuit 14 and stored in the non-volatile memory 2 as a code word. In the present embodiment, the encoding is optional. The memory controller 1 may store the unit data in the non-volatile memory 2 without encoding. FIG. 1 illustrates a configuration example in which the encoding is performed. If the memory controller 1 does not perform the encoding, the page data matches the unit data. In addition, one code word may be generated based on one unit data, or one code word may be generated based on divided data in which the unit data is divided. In addition, one code word may be generated using a plurality of unit data.

The processor 12 determines the memory region of the non-volatile memory 2 as a written destination for each unit data. A physical address is assigned to the memory region of the non-volatile memory 2. The processor 12 manages the memory region of the written destination of the unit data by using the physical address. The processor 12 specifies the determined memory region (physical address) and instructs the memory interface 15 to write the user data to the non-volatile memory 2. The processor 12 manages correspondence between a logical address (logical address managed by the host) and the physical address of the user data. When the processor 12 receives a read request including a logical address from the host, the processor 12 determines the physical address corresponding to the logical address, and instructs the memory interface 15 to read the user data from the physical address.

The ECC circuit 14 encodes the user data stored in the RAM 11 to generate the code word. In addition, the ECC circuit 14 decodes the code word read from the non-volatile memory 2.

The RAM 11 temporarily stores the user data received from the host before being stored in the non-volatile memory 2, or temporarily stores the data read from the non-volatile memory 2 before being transmitted to the host. The RAM 11 is, for example, a general-purpose memory such as a static random access memory (SRAM) or a dynamic random access memory (DRAM).

FIG. 1 illustrates a configuration example in which the memory controller 1 includes the ECC circuit 14 and the memory interface 15. However, the ECC circuit 14 may be built into the memory interface 15. In addition, the ECC circuit 14 may be built into the non-volatile memory 2.

When the write request is received from the host, the memory system works as follows. The processor 12 temporarily stores data to be written in the RAM 11. The processor 12 reads the data stored in the RAM 11 and inputs the data to the ECC circuit 14. The ECC circuit 14 encodes the input data and inputs the code word to the memory interface 15. The memory interface 15 writes the input code word to the non-volatile memory 2.

When the read request is received from the host, the memory system works as follows. The memory interface 15 inputs the code word read from the non-volatile memory 2 to the ECC circuit 14. The ECC circuit 14 decodes the input code word and stores the decoded data in the RAM 11. The processor 12 transmits the data stored in the RAM 11 to the host via the host interface 13.

(1-2. Configuration of Non-Volatile Memory)

Figure 2:
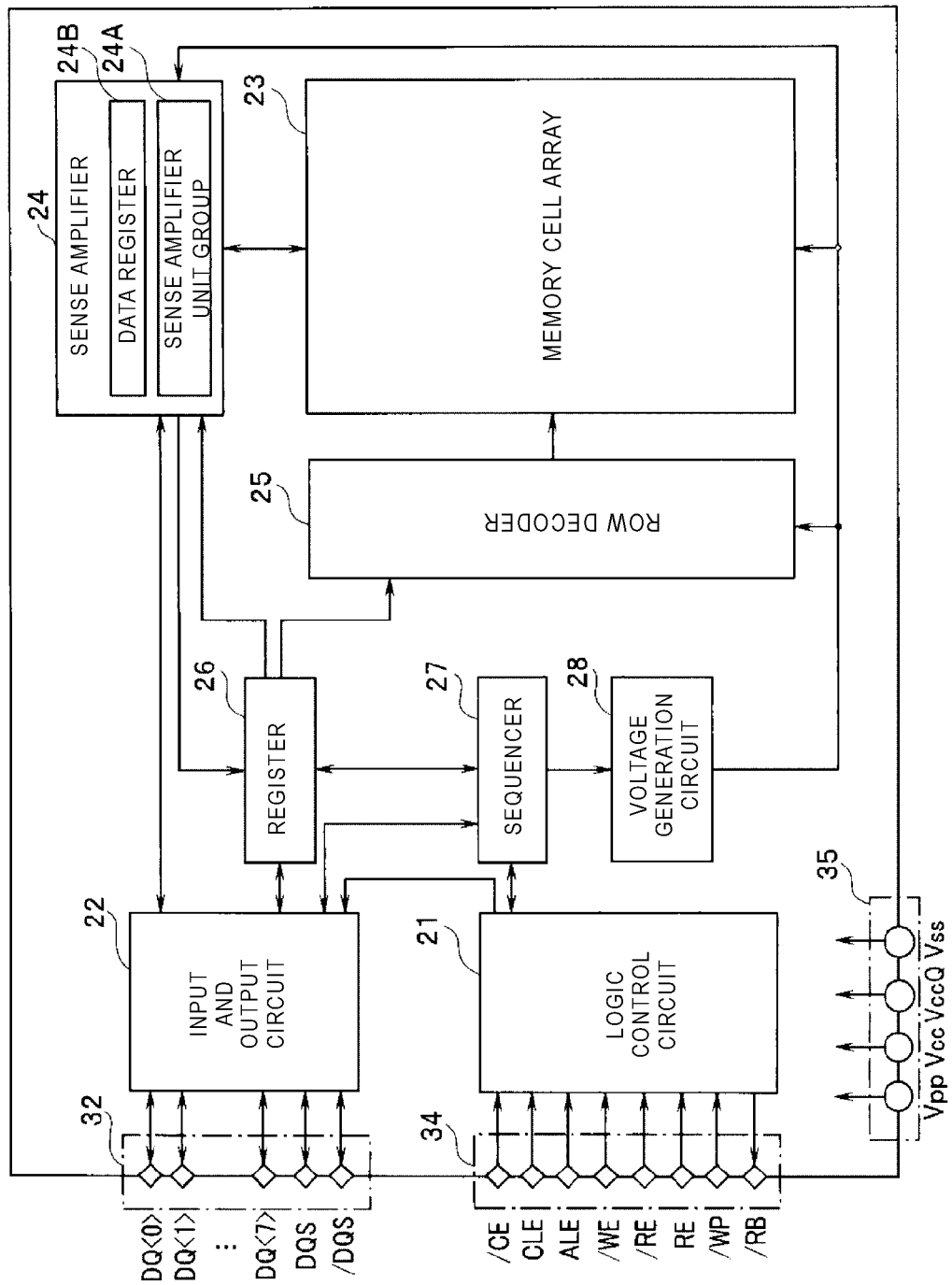
FIG. 2 is a block diagram illustrating a configuration example of the semiconductor storage device according to the embodiment.

FIG. 2 is a block diagram illustrating a configuration example of the non-volatile memory of the present embodiment. The non-volatile memory 2 includes a logic control circuit 21, an input and output circuit 22, a memory cell array 23, a sense amplifier 24, a row decoder 25, a register 26, a sequencer 27, a voltage generation circuit 28, an input and output pad group 32, a logic control pad group 34, and a power supply input terminal group 35.

The memory cell array 23 includes a plurality of blocks. Each of the plurality of blocks BLK includes a plurality of memory cell transistors (memory cells). A plurality of bit lines, a plurality of word lines, a source line, and the like are arranged in the memory cell array 23 in order to control voltages applied to the memory cell transistors. A specific configuration of the blocks BLK will be described later.

The input and output pad group 32 includes a plurality of terminals (pads) corresponding to the signal DQ <7: 0> and the data strobe signals DQS and /DQS in order to transmit and receive the signals including the data to and from the memory controller 1.

The logic control pad group 34 includes a plurality of terminals (pads) corresponding to the chip enable signal /CE, the command latch enable signal CLE, the address latch enable signal ALE, the write enable signal /WE, the read enable signals RE and /RE, and the write protect signal /WP in order to transmit and receive the signals to and from the memory controller 1.

The power supply input terminal group 35 includes a plurality of terminals for inputting power supply voltages Vcc, VccQ, and Vpp and a ground voltage Vss in order to supply various operation power supplies to the non-volatile memory 2 from the outside. The power supply voltage Vcc is a circuit power supply voltage generally given from the outside as an operation power supply, and for example, a voltage of about 3.3 V is input. For the power supply voltage VccQ, for example, a voltage of 1.2 V is input. The power supply voltage VccQ is used when transmitting and receiving the signals between the memory controller 1 and the non-volatile memory 2.

The power supply voltage Vpp is a power supply voltage higher than the power supply voltage Vcc, and for example, a voltage of 12 V is input. When data is written to the memory cell array 23 or data is erased, a high voltage of about 20V is required. It is possible to generate a desired voltage at high speed and with low power consumption by boosting the power supply voltage Vpp of about 12 V rather than boosting the power supply voltage Vcc of about 3.3 V by a booster circuit of the voltage generation circuit 28. The power supply voltage Vcc is a power supply that is normally supplied to the non-volatile memory 2, and the power supply voltage Vpp is a power supply that is additionally and optionally supplied according to, for example, a usage environment.

The logic control circuit 21 and the input and output circuit 22 are connected to the memory controller 1 via a NAND bus. The input and output circuit 22 transmits and receives the signals DQ (for example, DQ0 to DQ7) to and from the memory controller 1 via the NAND bus.

The logic control circuit 21 receives external control signals (for example, the chip enable signal /CE, the command latch enable signal CLE, the address latch enable signal ALE, the write enable signal /WE, the read enable signals RE and /RE, and the write protect signal /WP) from the memory controller 1 via the NAND bus. In addition, the logic control circuit 21 transmits a ready/busy signal /RB to the memory controller 1 via the NAND bus.

The input and output circuit 22 transmits and receives the signal DQ <7: 0> and the data strobe signals DQS and /DQS to and from the memory controller 1. The input and output circuit 22 transfers the command and the address in the signal DQ <7: 0> to the register 26. In addition, the input and output circuit 22 transmits and receives write data and read data to and from the sense amplifier 24.

The register 26 includes a command register, an address register, a status register, and the like. The command register temporarily stores a command. The address register temporarily stores an address. The status register temporarily stores data required for an operation of the non-volatile memory 2. The register 26 includes, for example, SRAM.

The sequencer 27 is a control circuit that receives a command from the register 26 and controls the non-volatile memory 2 according to a sequence based on this command.

The voltage generation circuit 28 receives a power supply voltage from the outside of the non-volatile memory 2, and uses this power supply voltage to generate a plurality of voltages required for a write operation, a read operation, and an erase operation. The voltage generation circuit 28 supplies the generated voltages to the memory cell array 23, the sense amplifier 24, the row decoder 25, and the like.

The row decoder 25 receives a row address from the register 26 and decodes the row address. The row decoder 25 performs a selection operation for the word line based on the decoded row address. Then, the row decoder 25 transfers the plurality of voltages required for the write operation, the read operation, and the erase operation to the selected block.

The sense amplifier 24 receives a column address from the register 26 and decodes the column address. The sense amplifier 24 has a sense amplifier unit group 24A and a data register 24B. The sense amplifier unit group 24A is connected to each of the bit lines, and one of the bit lines is selected based on the decoded column address. In addition, at the time of reading data, the sense amplifier unit group 24A detects and amplifies the data read from the memory cell transistors into the bit lines. In addition, at the time of writing data, the sense amplifier unit group 24A transfers the write data to the bit lines.

The data register 24B temporarily stores the data detected by the sense amplifier unit group 24A at the time of reading the data, and serially transfers the data to the input and output circuit 22. In addition, at the time of writing the data, the data register 24B temporarily stores the data serially transferred from the input and output circuit 22 and transfers the data to the sense amplifier unit group 24A. The data register 24B includes SRAM or the like.

(1-3. Block Configuration of Memory Cell Array)

Figure 3:
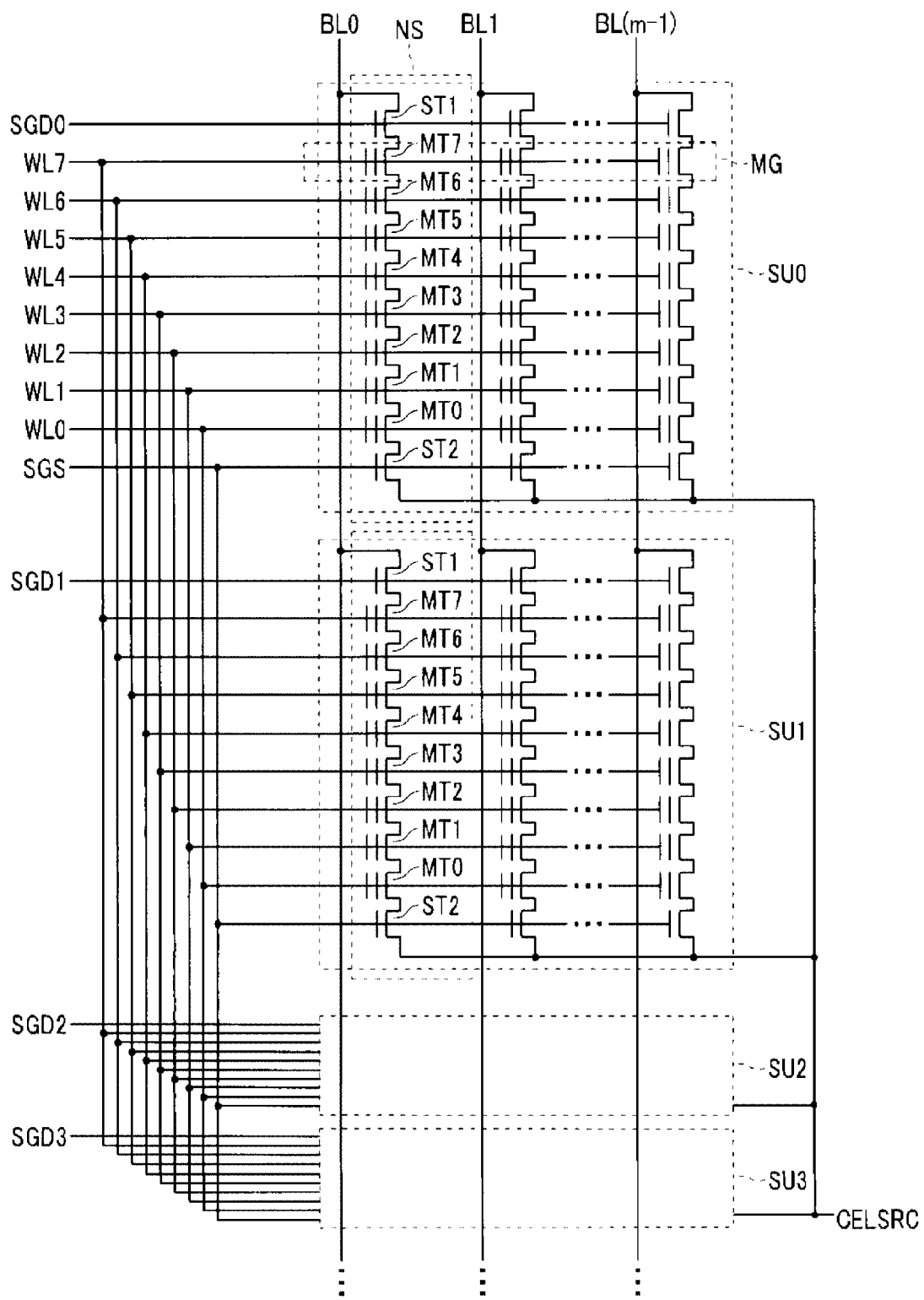
FIG. 3 is a circuit diagram illustrating a configuration example of a block of a memory cell array having a three-dimensional structure.

FIG. 3 is a circuit diagram illustrating a configuration example of a block of a memory cell array having a three-dimensional structure. FIG. 3 illustrates one block BLK of a plurality of blocks constituting the memory cell array 23. Another block of the memory cell array also has the same configuration as in FIG. 3.

As illustrated in FIG. 3, the block BLK includes, for example, four string units (SU0 to SU3). In addition, each of the string units SU includes a plurality of NAND strings NS. Each of the NAND strings NS includes eight memory cell transistors MT (MT0 to MT7) and select gate transistors ST1 and ST2. Each of the memory cell transistors MT includes a gate and a charge storage layer, and stores data in a non-volatile manner. In addition, the number of memory cell transistors MT in each of the NAND strings NS is eight for convenience, but may be more.

Although the select gate transistors ST1 and ST2 are depicted in the circuit diagram differently from memory cell transistors MT, they may be structurally the same as the memory cell transistors. In addition, for example, a plurality of select gate transistors may be used as the select gate transistors ST1 and ST2, respectively. Further, a dummy cell transistor may be provided between each of the memory cell transistors MT and each of the select gate transistors ST1 and ST2.

The memory cell transistors MT are connected in series between the select gate transistors ST1 and ST2. The memory cell transistor MT7 on one end side is connected to the select gate transistor ST1, and the memory cell transistor MT0 on another end side is connected to the select gate transistor ST2.

Gates of the select gate transistor ST1 of the string units SU0 to SU3 are connected to select gate lines SGD0 to SGD3 (hereinafter, when it is not necessary to distinguish them, they are referred to as a select gate line SGD), respectively. On the other hand, gates of the select gate transistor ST2 are commonly connected to the same select gate lines SGS across a plurality of string units SU in the same block BLK. In addition, gates of the memory cell transistors MT0 to MT7 in the same block BLK are commonly connected to word lines WL0 to WL7, respectively. That is, the word lines WL0 to WL7 and the select gate lines SGS are commonly connected across a plurality of string units SU0 to SU4 in the same block BLK, whereas the select gate lines SGD are independent for each of the string units SU0 to SU3 even in the same block BLK.

The word lines WL0 to WL7 are connected to the gates of the memory cell transistors MT0 to MT7 constituting the NAND strings NS, respectively. A gate of a memory cell transistor MTi in the same row in the block BLK are connected to the same word line WLi. In the following description, the NAND strings NS may be more generally referred to as "strings" or "memory strings".

Each of the NAND strings NS is connected to a corresponding bit line. Therefore, each of the memory cell transistors MT is connected to the bit line via the select gate transistor ST in the NAND strings NS or another memory cell transistor MT. As described above, the data of the memory cell transistors MT in the same block BLK are collectively erased. On the other hand, the data reading and the data writing are performed in units of a memory cell group MG (or page unit). In the present specification, a plurality of memory cell transistors MT connected to one word line WLi and belonging to one string unit SU are defined as a memory cell group MG. During performing the read operation and the write operation, one word line WLi and one select gate line SGD are selected according to the physical address, and the memory cell group MG is selected.

(1-4. Planar Structure of Non-Volatile Memory)

Figure 4A:
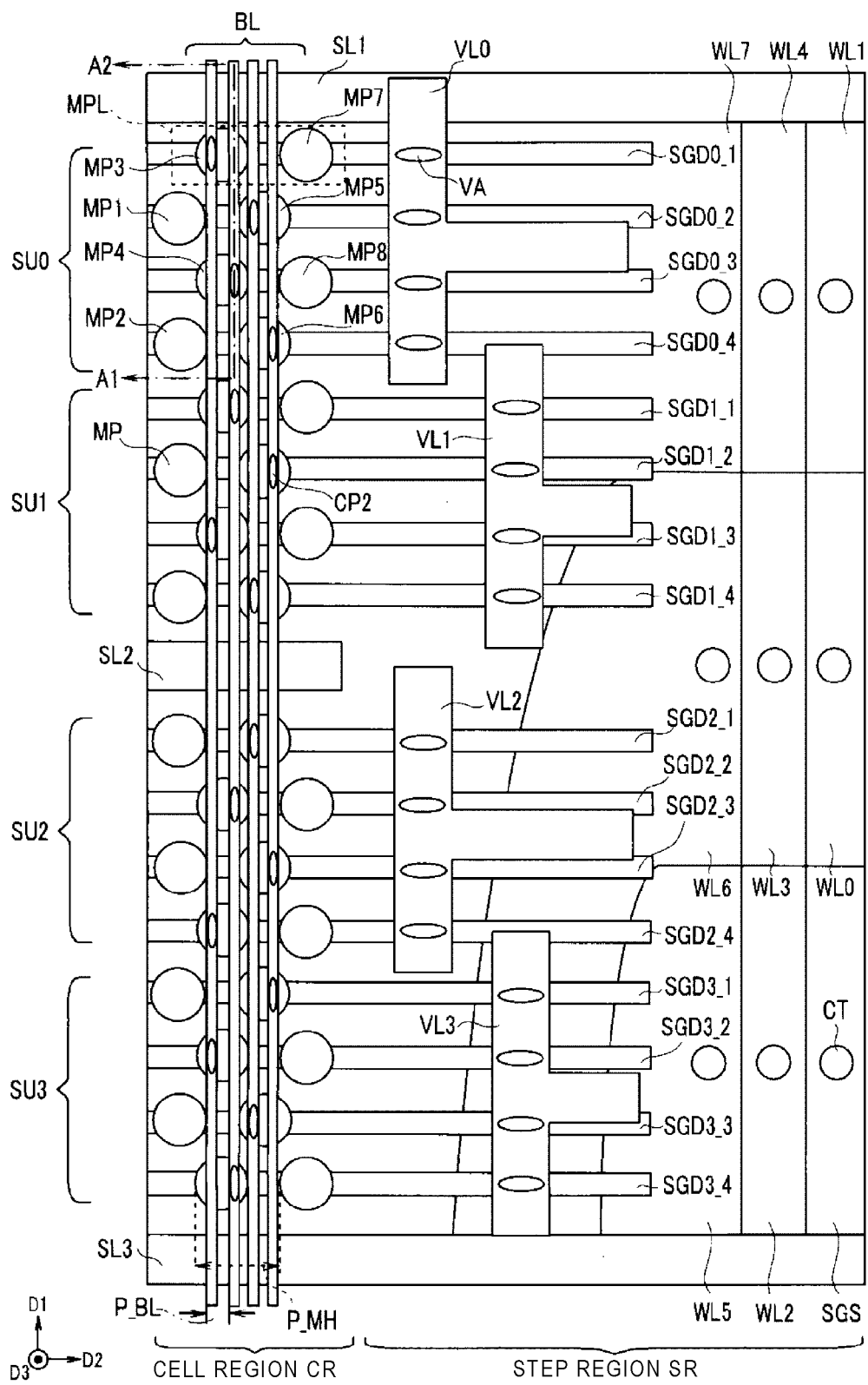
FIGS. 4A-4D are schematic diagrams of a partial region of the memory cell array having the three-dimensional structure.

FIG. 4A is a schematic diagram of a partial region of the memory cell array having the three-dimensional structure. FIG. 4A illustrates a schematic diagram of one block BLK. In the following description, a direction in which bit lines BL extend on a plane parallel to a surface of the semiconductor substrate is defined as D1. In addition, a direction parallel to the surface of the semiconductor substrate and orthogonal to the D1 is defined as D2. In addition, a direction orthogonal to the surface of the semiconductor substrate is defined as D3.

The memory cell array 23 has a cell region CR and a step region SR. The cell region CR is a region in which the NAND string NS is formed. The step region SR is a region in which contacts CT that connect the select gate lines SGS and word lines WL0 to WL7 and a wiring layer (not illustrated) located above in the D3 direction are formed. In the present embodiment, the select gate lines SGS and the word lines WL0 to WL7 are sequentially stacked on the semiconductor substrate. When viewed from above in the D3 direction, since the contacts CT connected to the word lines WL0 to WL7 and the select gate lines SGS do not overlap each other, an area of a wiring located in a lower layer is larger than an area of a wiring located in an upper layer. That is, an upper surface of the select gate lines SGS on which the word line WL0 is not stacked, forms a step. Similarly, an upper surface of the word line WLi (i=0 to 6) on which a word line WL (i+1) is not stacked, forms a step. The contacts CT are formed on these steps. FIG. 4A illustrates an example of the step region SR having a three-row step structure. That is, the select gate lines SGS and the word lines WL0 to WL7 are processed so that steps adjacent to each other in the D2 direction are separated three layers and steps adjacent to each other in the D1 direction are separated by one layer.

FIG. 4A illustrates a part of the cell region CR and a part of the step region SR that are formed in the memory cell array 23. As illustrated in FIG. 4A, slits SL1 to SL3 extending in the D2 direction are provided on two side surfaces of the word line WL extending in the D2 direction facing the D1 direction.

The four string units SU0 to SU3 constituting one block BLK are arranged side by side in the D1 direction. The slit SL1 is provided between the string unit SU0 and a string unit SU of another block BLK (not illustrated). In addition, the slit SL2 is provided between the string units SU1 and SU2. Further, the slit SL3 is provided between the string unit SU3 and a string unit SU of another block BLK (not illustrated). That is, four string units SU0 to SU3 are arranged between the slit SL1 and the slit SL3. The slits SL1 to SL3 separate the select gate lines SGS and the word lines WL. Further, the slits SL1 and SL3 extend from the cell region CR to the step region SR, and divide the select gate lines SGS and the word lines WL0 to WL7 between the adjacent blocks BLK. On the other hand, the slit SL2 is formed only in the cell region CR and separates the select gate lines SGS and the word lines WL0 to WL7, but does not reach the step region SR. That is, in the step region SR located on a right side of the slit SL2 in the D2 direction, the select gate lines SGS and the word lines WL0 to WL7 are electrically connected.

The string units SU are provided with a plurality of memory pillars MP. The memory pillars MP correspond to the memory cell transistors MT0 to MT7 and the select gate transistors ST1 and ST2 in each of the NAND strings NS. The memory pillars MP formed by extending in the D3 direction penetrate the select gate lines SGS and the word lines WL0 to WL7. The details of a structure of the memory pillars MP will be described later.

The memory pillars MP of the cell region CR are arranged in an 8-row staggered pattern. That is, eight memory pillar rows MPL including a plurality of memory pillars MP having the same position in the D1 direction and arranged at equal intervals in the D2 direction are arranged between adjacent slits SL. In an example illustrated in FIG. 4A, since two string units SU are arranged between the slits SL, one string unit SU includes four memory pillar rows MPL.

More specifically, for example, in the string unit SU0, a memory pillar MP1 and a memory pillar MP2 are arranged adjacent to each other in the D1 direction, and a memory pillar MP3 and a memory pillar MP4 are arranged adjacent to each other in the D1 direction. In addition, a memory pillar MP5 and a memory pillar MP6 are arranged adjacent to each other in the D1 direction, and a memory pillar MP7 and a memory pillar MP8 are arranged adjacent to each other in the D1 direction. Further, the memory pillar MP3 and the memory pillar MP7 are arranged adjacent to each other in the D2 direction, and the memory pillar MP1 and the memory pillar MP5 are arranged adjacent to each other in the D2 direction. In addition, the memory pillar MP4 and the memory pillar MP8 are arranged adjacent to each other in the D2 direction, and the memory pillar MP2 and the memory pillar MP6 are arranged adjacent to each other in the D2 direction.

Also, the memory pillar MP1 is arranged between the memory pillar MP3 and the memory pillar MP4 in the D1 direction, and is arranged at a position different from the memory pillar MP3 and the memory pillar MP4 in the D2 direction. The memory pillar MP4 is arranged between the memory pillar MP1 and the memory pillar MP2 in the D1 direction, and is arranged at a position different from the memory pillar MP1 and the memory pillar MP2 in the D2 direction. In addition, the memory pillar MP5 is arranged between the memory pillar MP7 and the memory pillar MP8 in the D1 direction, and is arranged at a position different from the memory pillar MP7 and the memory pillar MP8 in the D2 direction. The memory pillar MP8 is arranged between the memory pillar MP5 and the memory pillar MP6 in the D1 direction, and is arranged at a position different from the memory pillar MP5 and the memory pillar MP6 in the D2 direction.

The select gate lines SGD are formed by extending in the D2 direction. Four select gate lines SGD are arranged in each of the string units SU0 to SU3. That is, the memory pillar rows MPL and the select gate lines SGD are in one-to-one correspondence. In the following description, a subscripted code is used to represent a specific select gate line. For example, a select gate line arranged at a kth line from the top in the D1 direction of a string unit SUj (j=0, 1, 2, . . . ) is referred to as a select gate line SGDj_k. When representing any select gate line SGD, it is expressed as the select gate line SGD.

Four select gate lines SGD0_1, SGD0_2, SGD0_3, and SGD0_4 are arranged in the string unit SU0. The select gate lines SGD0_1, SGD0_2, SGD0_3, and SGD0_4 are arranged at different positions in the D1 direction. A width (a length in the D1 direction) of the select gate line SGD is smaller than a diameter of the memory pillar MP. The select gate line SGD0_1 penetrates the plurality of memory pillars MP3 and MP7 that are arranged at the same position in the D1 direction and arranged side by side along the D2 direction. In addition, the select gate line SGD0_2 penetrates the plurality of memory pillars MP1 and MP5 that are arranged at the same position in the D1 direction, and arranged side by side along the D2 direction. Further, the select gate line SGD0_3 penetrates the plurality of memory pillars MP4 and MP8 that are arranged at the same position in the D1 direction, and arranged side by side along the D2 direction. In addition, the select gate line SGD0_4 penetrates the plurality of memory pillars MP2 and MP6 that are arranged at the same position in the D1 direction, and arranged side by side along the D2 direction. That is, the select gate lines SGD and the memory pillars MP are arranged such that any one of the plurality of select gate lines SGD penetrates one memory pillar MP. The select gate transistor ST1 is formed at an intersection of the select gate lines SGD and the memory pillars MP.

The four select gate lines SGD0_1, SGD0_2, SGD0_3, and SGD0_4 arranged in the string unit SU0 are electrically connected to a wiring VL0 by vias VA in the step region SR. That is, the same voltage is applied from the wiring VL0 to the select gate lines SGD0_1, SGD0_2, SGD0_3, and SGD0_4. Similarly, the select gate lines SGD1_0 to SGD1_3 are electrically connected to a wiring VL1 by the vias VA, the select gate lines SGD2_0 to SGD2_3 are electrically connected to a wiring VL2 by the vias VA, and the select gate lines SGD3_0 to SGD3_3 are electrically connected to a wiring VL3 by the vias VA, in the step region SR. That is, since a voltage is applied from the same wiring VL to the select gate lines SGD arranged in the same string unit SU, and a voltage is applied from different wirings VL to the select gate lines arranged in different string units SU, it is possible to apply voltages independent of each other to the select gate lines SGD belonging to the different string units SU. Further, a cross-sectional shape of the via VA is represented by an ellipse, but it may be a circular shape or the like.

Contact plugs CP2 are formed on the memory pillar MP. In addition, the contact plug CP2 is connected to any one of the plurality of bit lines BL extending in the D1 direction. That is, the plurality of memory pillars MP in the string unit SU are connected to the different bit lines BL via contact plugs CP2. More specifically, for example, the memory pillars MP1 to MP8 are connected to the different bit lines BL, respectively. One memory pillar MP of each of the string units SU is commonly connected to one bit line BL. As illustrated in FIG. 4A, in each of the string units SU, when the plurality of memory pillars MP are arranged in a 4-row staggered pattern, a width of each of the bit lines BL is set to a width such that two bit lines BL can be arranged above one memory pillar MP. That is, a bit line pitch P_BL (bit line width+bit line interval) is one-fourth of a memory hole pitch P_MH (diameter of memory hole MH+interval between memory holes adjacent in the D2 direction).

Figure 4B:
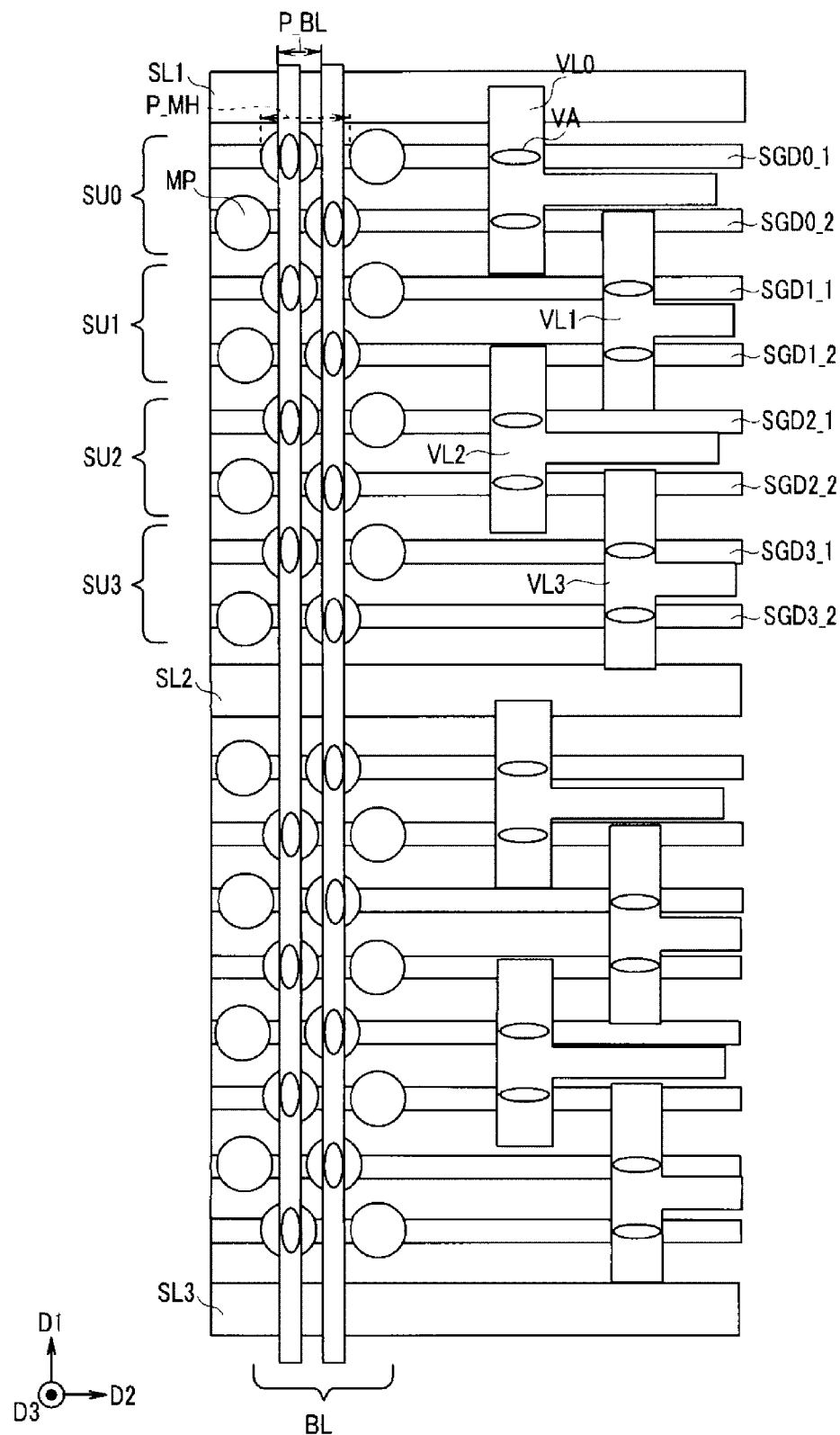

Further, the number of string units SU constituting one block BLK and the number of memory pillar rows MPL constituting one string unit SU can be optionally set. For example, in the memory pillars MP having the 8-row staggered pattern, one block BLK may include four string units SU, and one string unit SU may include two memory pillar rows. FIG. 4B illustrates another schematic diagram of the memory cell array. In the memory cell array illustrated in FIG. 4B, the plurality of memory pillars MP of each of the string units SU are arranged in a 2-row staggered pattern in the D2 direction. Four string units SU0 to SU3 constituting one block BLK are arranged between the slit SL1 and the slit SL2, and four string units SU0 to SU3 constituting another block BLK are arranged between the slit SL2 and the slit SL3.

The string unit SU0 includes two select gate lines SGD0_1 and SGD0_2. The select gate lines SGD0_1 and SGD0_2 are electrically connected to the wiring VL0 by the vias VA. Similarly, the select gate lines SGD1_1 and SGD1_2 are electrically connected to the wiring VL1 by the vias VA, the select gate lines SGD2_1 and SGD2_2 are electrically connected to the wiring VL2 by the vias VA, and the select gate lines SGD3_0 and SGD3_1 are electrically connected to the wiring VL3 by the vias VA, respectively. That is, it is possible to apply voltages independent of each other to the select gate lines SGD belonging to the different string units SU. Further, in each of the string units SU, when the plurality of memory pillars MP are arranged in the 2-row staggered pattern, the width of each of the bit lines BL is set to a width in which one bit line BL can be arranged above one memory pillar MP. That is, a bit line pitch P_BL is half of the memory hole pitch P_MH. Therefore, the width of the bit lines is formed wider in the configuration illustrated in FIG. 4B than in the configuration illustrated in FIG. 4A.

Figure 4C:
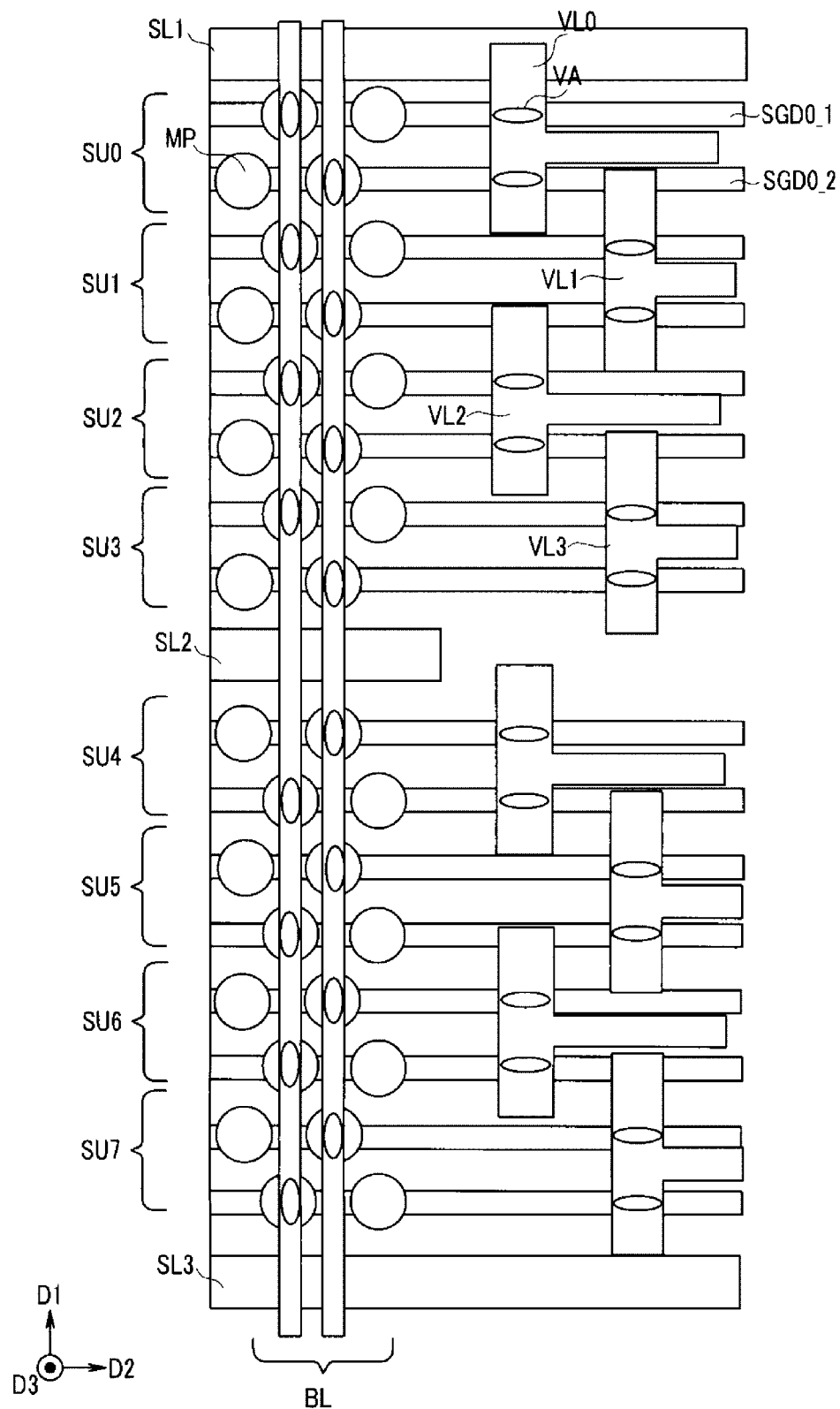
Figure 4D:
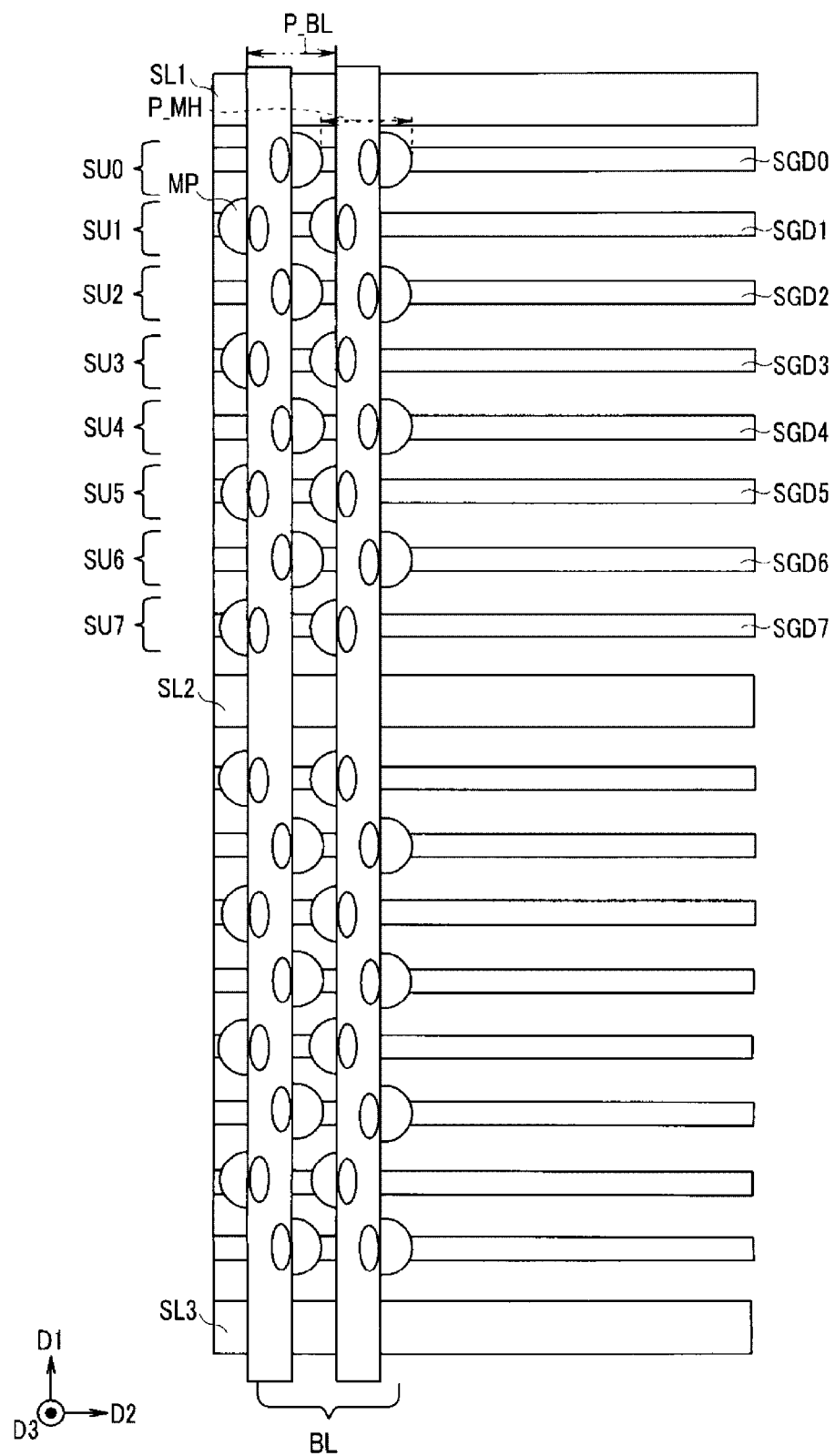

FIGS. 4C and 4D illustrate another schematic diagram of the memory cell array. FIG. 4C is a diagram illustrating a case where one block BLK includes eight string units SU and one string unit SU includes two memory pillar rows in the memory pillars MP having the 8-row staggered pattern.

FIG. 4D is a diagram illustrating a case where one block BLK includes eight string units SU and one string unit SU includes one memory pillar row in the memory pillars MP having the 8-row staggered pattern. Further, as illustrated in FIG. 4D, in each of the string units SU, when the plurality of memory pillars MP are arranged in a 1-row staggered pattern, a width of each of the bit lines BL is set to a width in which one bit line BL can be arranged above two memory pillars MP. That is, the bit line pitch P_BL is the same as the memory hole pitch P_MH. As described above, the number of string units SU constituting one block BLK and the number of memory pillar rows MPL constituting one string unit SU can be optionally set.

In addition, the arrangement of the memory pillars MP may be another arrangement pattern other than the staggered pattern. Regardless of the arrangement of the memory pillars MP, the select gate line SGD of each of the string units SU extends in a predetermined direction (D2 direction in the case of FIGS. 4A to 4D), and penetrates the plurality of memory pillars MP arranged along the same direction as the select gate lines SGD in each of the string units SU.

(1-5. Cross-Sectional Structure of Non-Volatile Memory)

Figure 5A:
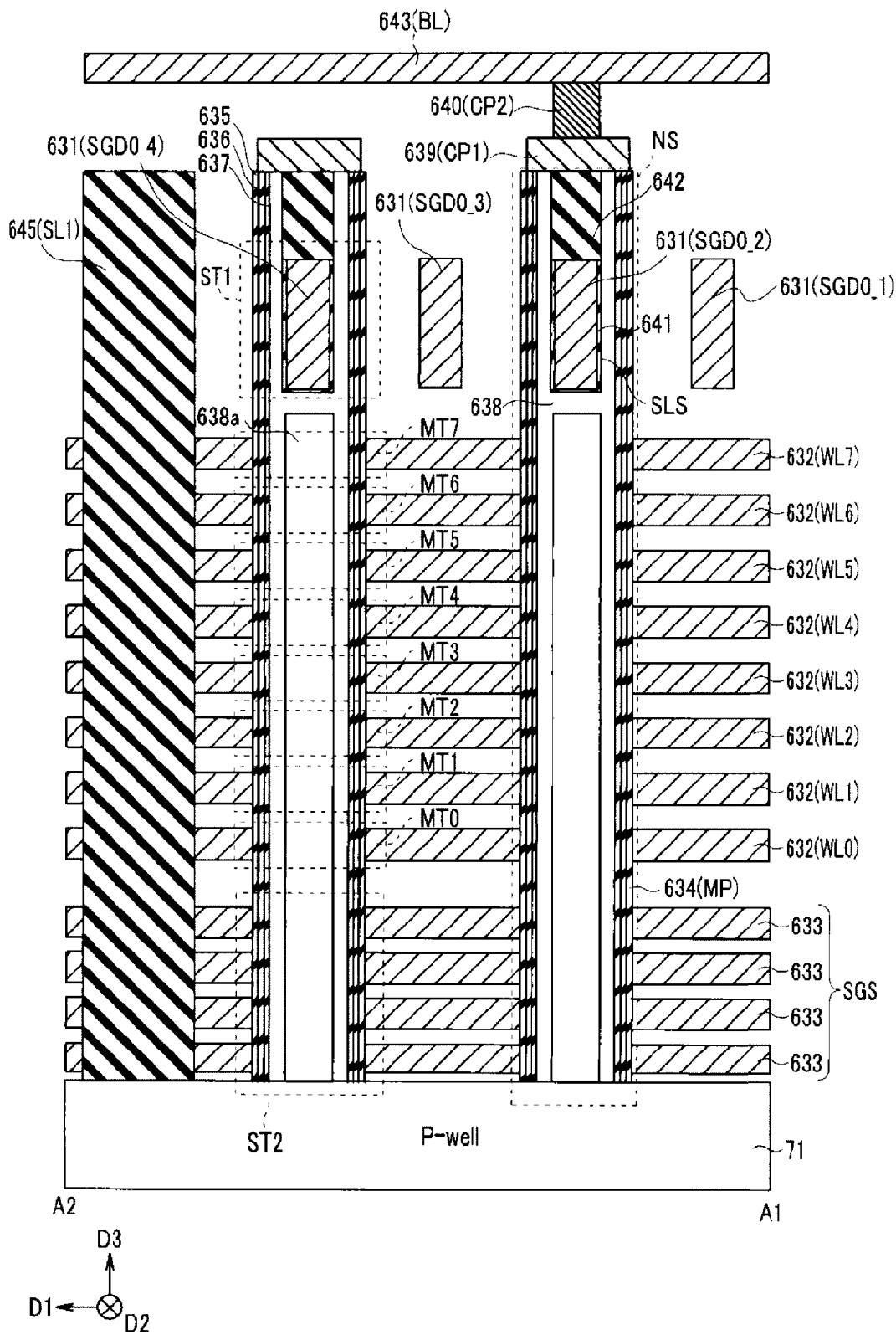
FIG. 5A is a cross-sectional view of a partial region of the memory cell array having the three-dimensional structure.

Next, the cross-sectional structure of the memory cell array will be described with reference to FIG. 5A. FIG. 5A is a cross-sectional diagram of a partial region of the memory cell array having the three-dimensional structure, and is a cross-sectional diagram of a cross-section taken along line A1-A2 in FIG. 4A.

The memory cell array 23 has a three-dimensional structure. As illustrated in FIG. 5A, the plurality of NAND strings NS are formed on a p-type well region (P-well). That is, a plurality of wiring layers 633 that function as the select gate lines SGS are stacked on the p-type well region. Further, a plurality of wiring layers 632 as the first wirings, which function as the word lines WLi, are stacked on an upper layer of the wiring layers 633. An insulating layer (not illustrated) is provided between the wiring layers of these wiring layers 632 and 633 adjacent to each other in the D3 direction. Further, FIG. 5A illustrates a structure in which eight wiring layers 632 that function as the word lines WLi are stacked for convenience. A plurality of wiring layers 632 may be further stacked.

Then, a memory pillar 634 that penetrates these wiring layers 633 and 632 and reaches the p-type well region is formed. A block insulating film 635, a charge storage layer 636, and a tunnel insulating film 637 are sequentially formed on a side surface of the memory pillar 634, and a semiconductor pillar 638 is further embedded in each of the memory pillars 634. The semiconductor pillar 638 is made of polysilicon, for example, and functions as a region where channels are formed while the memory cell transistors MT and the select gate transistors ST1 and ST2 in the NAND strings NS operate. For example, portions where the memory pillar 634 and the wiring layers 633 intersect function as the select gate transistor ST2. Portions where the memory pillar 634 and the wiring layers 632 intersect function as the memory cell transistors (memory cell) MT.

Further, a core layer 638a is embedded in each semiconductor pillar 638. An upper surface of the core layer 638a is formed at a position lower than an upper surface of the memory pillar 634 by a predetermined distance in the D3 direction and higher than an upper surface of the wiring layers 632 at the highest position by a predetermined distance in the D3 direction. The semiconductor pillar 638 is located on the core layer 638a. That is, the core layer 638a is surrounded by the semiconductor pillar 638 in the D1, D2, and D3 directions. Above the core layer 638a of each of the memory pillars 634, a slit SLS that passes through a central axis of the semiconductor pillar 638 and extends in the D2 direction is formed. The select gate transistor ST1 is formed in this slit SLS.

A plurality of wiring layers 631 (second wiring) extending in the D2 direction are formed above the wiring layers 632, more specifically, in a region extending from the uppermost surface of the wiring layers 632 to the upper surface of the memory pillar 634. The plurality of wiring layers 631 functioning as the select gate lines SGDs are arranged at intervals in the D1 direction. A length of the wiring layers 631 in the D1 direction is shorter than a length of the semiconductor pillar 638 in the D1 direction. In addition, the length of the wiring layers 631 in the D3 direction is longer than the length thereof in the D1 direction. The length of the wiring layers 631 in the D3 direction is set to a length corresponding to a cutoff characteristic required for the select gate transistor ST1, and is, for example, about 3 to 4 times of a thickness of the wiring layers 632 in the D3 direction. Each of the wiring layers 631 passes through the slit SLS of the plurality of memory pillars 634 arranged at the same position in the D1 direction (FIG. 4A). A gate insulating film 641 is formed on a surface of the semiconductor pillar 638 facing each of the wiring layers 631. A conductive layer serving as a barrier metal is formed between the wiring layers 631 and the gate insulating film 641 (not illustrated). An insulating layer 642 is filled in the slit SLS above the upper surface of each of the wiring layers 631.

Figure 5B:
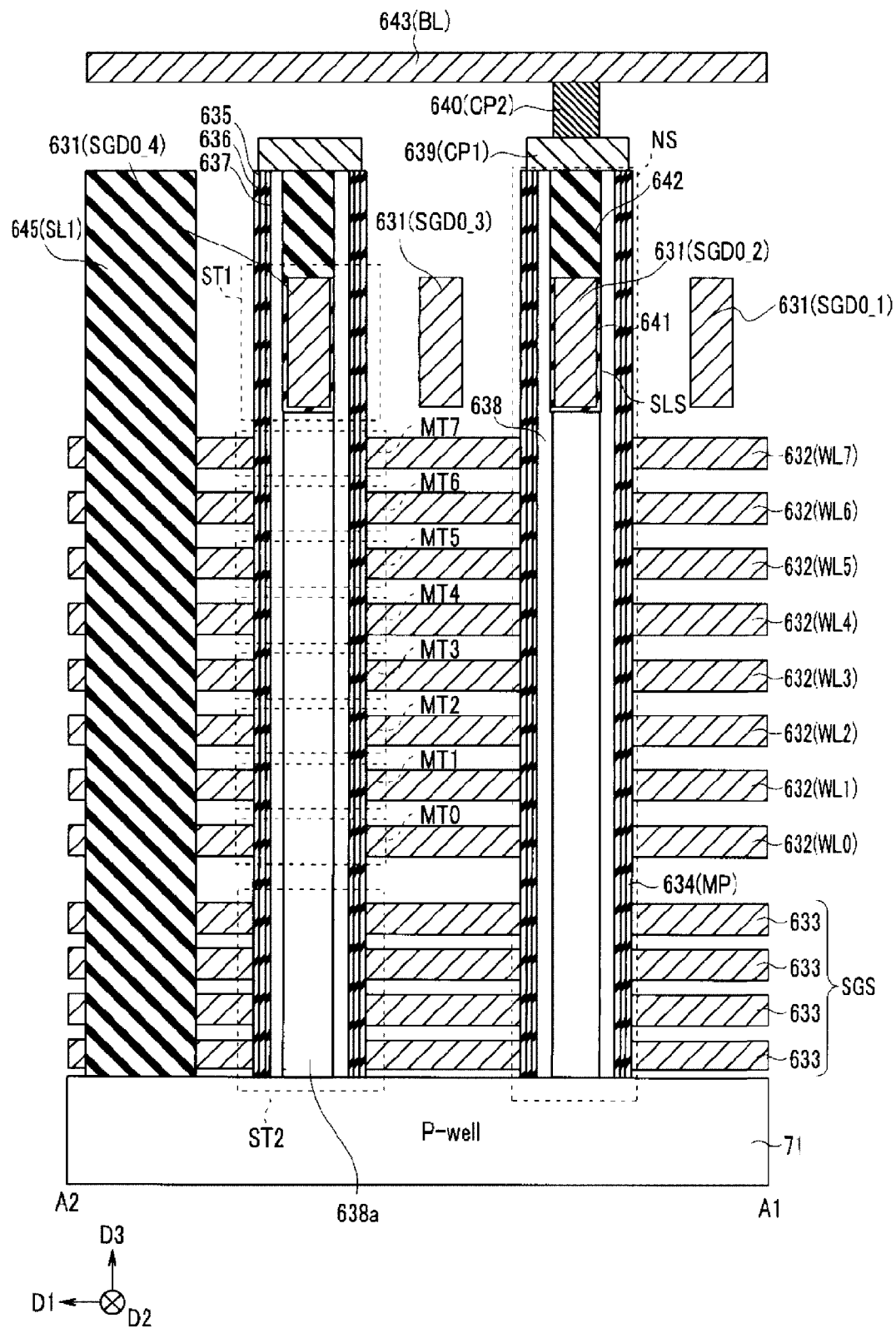
FIG. 5B is another cross-sectional view of the partial region of the memory cell array having the three-dimensional structure.

As illustrated in FIG. 5B, the semiconductor pillar 638 may not be provided on the core layer 638a, and the upper surface of the core layer 638a and a lower surface of the gate insulating film 641 may be in direct contact with each other. FIG. 5B is another cross-sectional diagram of a partial region of the memory cell array having a three-dimensional structure.

The block insulating film 635, the tunnel insulating film 637, the gate insulating film 641, the core layer 638a, and the insulating layer 642 are formed of, for example, a silicon oxide film. The charge storage layer 636 is formed of, for example, a silicon nitride film.

A wiring layer 643 is provided above the upper surface of the memory pillar 634 via an insulating layer. The wiring layers 643 extending in the D1 direction are formed in a band shape and correspond to the bit lines BL. A plurality of wiring layers 643 are arranged at intervals in the D2 direction (FIG. 4A).

A first contact plug 639 is provided at an upper end of each semiconductor pillar 638. Further, a second contact plug 640 is provided at an upper end of the first contact plug. The first contact plug 639 and the second contact plug 640 are formed of, for example, a conductor such as tungsten, and electrically connect the semiconductor pillar 638 and the wiring layer 643. Specifically, the wiring layer 643 is electrically connected to the semiconductor pillar 638 of one memory pillar 634 corresponding to each of the string units SU via the first contact plug 639 and the second contact plug 640. Further, the present embodiment is not limited to such a configuration, and the semiconductor pillar 638 in the memory pillar 634 and the wiring layer 643 may be connected via a plurality of contacts, wirings, or the like.

(2. Manufacturing Method)

Next, an example of a method for manufacturing the memory cell array 23 in the present embodiment will be described. FIGS. 6 to 10 illustrate a plan view of a memory cell array illustrating an example of a manufacturing process of a memory cell array according to the embodiment and a cross-sectional view of a cross section taken along the line A1-A2, respectively. The cross-sectional views of FIGS. 6 to 10 illustrate the portions above WL6 (which is the second layer from the top of the wiring layer 632) and below the first contact plug 639.

Hereinafter, as a method for forming the wiring layers 632 and 633, a method for forming a structure corresponding to the wiring layers 632 and 633 with a sacrificial layer and then removing the sacrificial layer to replace the sacrificial layer with a conductive material (hereinafter, referred to as "replacement") will be described.

First, insulating layers and four sacrificial layers corresponding to the wiring layers 633 are alternately stacked on a semiconductor substrate 71 by a chemical vapor deposition (CVD) or the like. Next, insulating layers 651 and eight sacrificial layers 632a corresponding to the wiring layers 632 are alternately stacked. A material having a high selection ratio of wet etching to the insulating layers 651 is used for the sacrificial layers 632a. For example, when the insulating layers 651 are formed of a silicon oxide film, a silicon nitride film is used for the sacrificial layers 632a.

Next, the memory pillars MP are formed. Specifically, first, a hard mask is formed on an upper surface of the uppermost insulating layer 651, and a hard mask in a memory pillar MP forming region is removed. That is, the hard mask is patterned so that the insulating layers 651 are exposed only in the memory pillar MP forming region. Next, anisotropic etching is used to form a deep hole (hole) penetrating the twelve sacrificial layers 632a and the insulating layers and reaching, with a bottom surface of the hole, the semiconductor substrate 71 as a source line. After removing the hard mask, the block insulating film 635, the charge storage layer 636, and the tunnel insulating film 637 are sequentially stacked.

Subsequently, the uppermost insulating layer 651, the block insulating film 635 on a bottom surface of the hole, the charge storage layer 636, and the tunnel insulating film 637 are removed by the anisotropic etching or the like to expose the semiconductor substrate 71 at the bottom surface of the hole. After a polysilicon film and the silicon oxide film are sequentially deposited on an entire surface by the CVD or the like, etch-back (etching the entire surface of a portion exposed on the upper surface by the anisotropic etching without using the hard mask) is performed to embed the semiconductor pillar 638 and the core layer 638a in the hole. Subsequently, the core layer 638a in the hole is removed to a position higher than the uppermost sacrificial layer 632a by a predetermined distance. After the polysilicon film is deposited on the entire surface by the CVD or the like, the etch-back is performed to embed the semiconductor pillar 638 in an upper portion of the hole.

Figure 6:
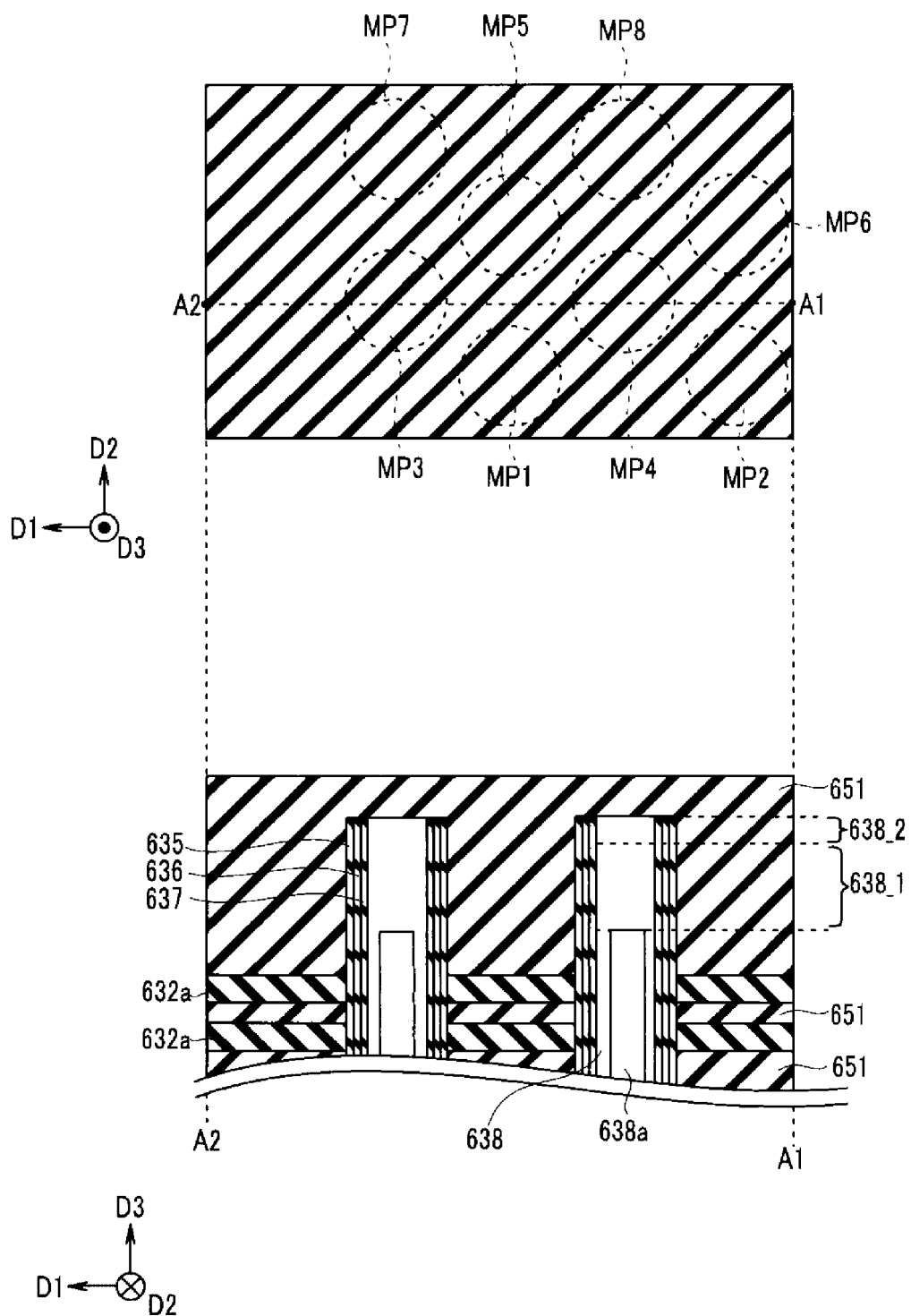
FIG. 6 is a plan view and a cross-sectional view of the memory cell array illustrating an example of a manufacturing process of the memory cell array according to the embodiment.

A p-type impurity (for example, boron (B)) is implanted and diffused from the upper surface of the core layer 638a of the semiconductor pillar 638 to a portion from the upper surface of the hole to a predetermined depth by using an ion implantation technique and a diffusion technique to form a p-type impurity layer 638_1. Further, an n-type impurity (for example, arsenic (As)) is implanted and diffused into the portion of the semiconductor pillar 638 from the upper surface of the hole to a predetermined depth by using the ion implantation technique and the diffusion technique to form an n-type impurity layer 638_2. The p-type impurity layer 638_1 is used as a region where a channel of the select gate transistor ST1 is formed. The n-type impurity layer 638_2 makes a connection between the first contact plug 639 to be formed later and the semiconductor pillar 638 low resistance. Further, the insulating layer 651 is deposited on the entire surface of the upper surface by using the CVD or the like. The structure illustrated in FIG. 6 is formed by executing the above series of procedures.

Figure 7:
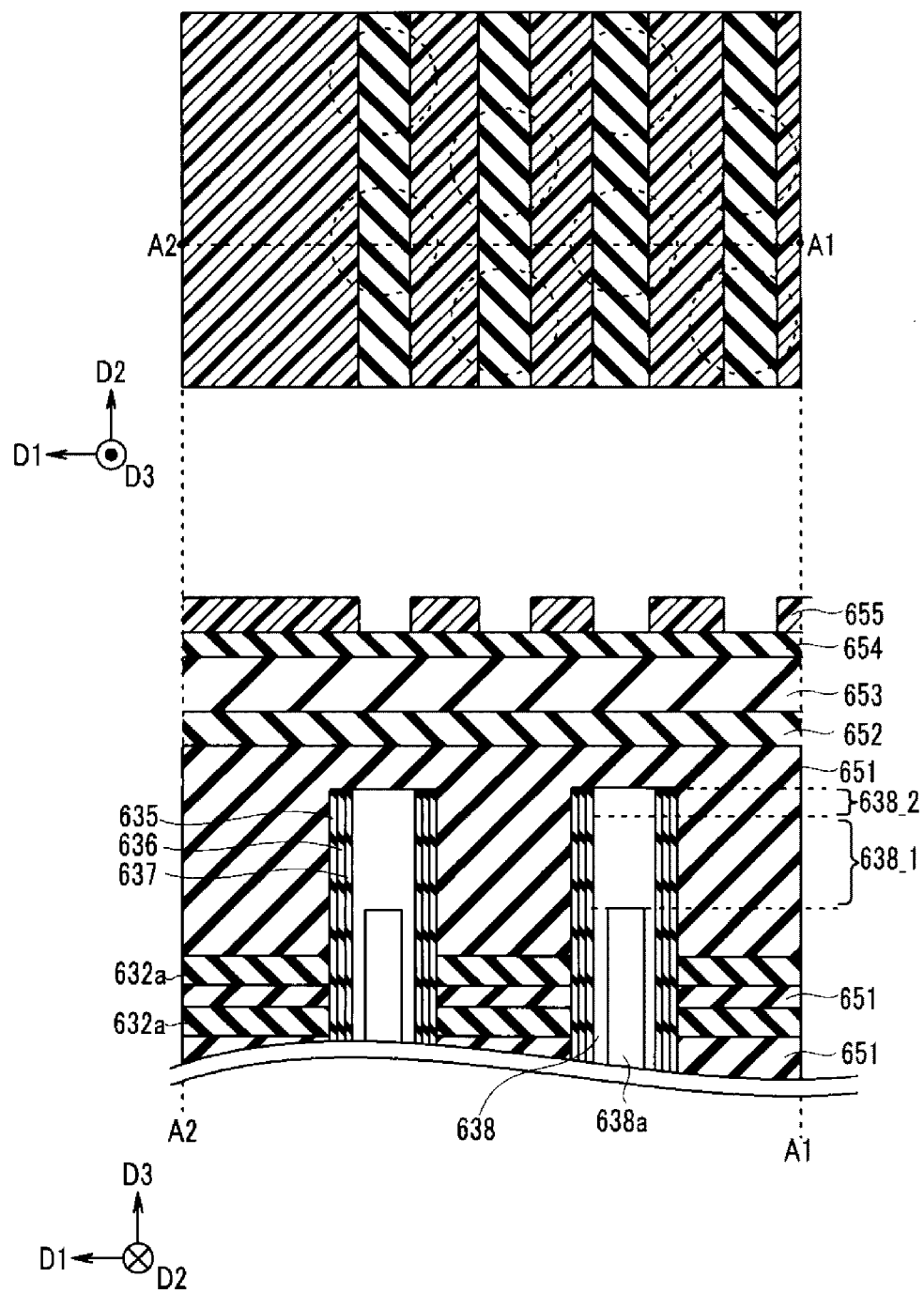
FIG. 7 is a plan view and a cross-sectional view of the memory cell array illustrating an example of a manufacturing process of the memory cell array according to the embodiment.

Next, an etch stopper layer 652, an underlying layer 653, and an insulating layer 654 are sequentially stacked on the entire surface by using the CVD or the like. The etch stopper layer 652 is formed of a film having a large etch selection ratio with the film forming the insulating layer 642 to be formed later. For example, when the insulating layer 642 is formed of a silicon oxide film, the etch stopper layer 652 is formed of a silicon nitride film. The underlying layer 653 is formed of, for example, a carbon-containing film (spin on carbon (SOC) film or the like). The insulating layer 654 is formed of, for example, a spin on glass (SOG) film. A hard mask 655 is formed on an upper surface of the insulating layer 654, and the hard mask 655 in a slit SLS forming region is removed. That is, the hard mask 655 is patterned so that the insulating layer 654 is exposed only in the slit SLS forming region. The structure illustrated in FIG. 7 is formed by executing the above procedures.

Figure 8:
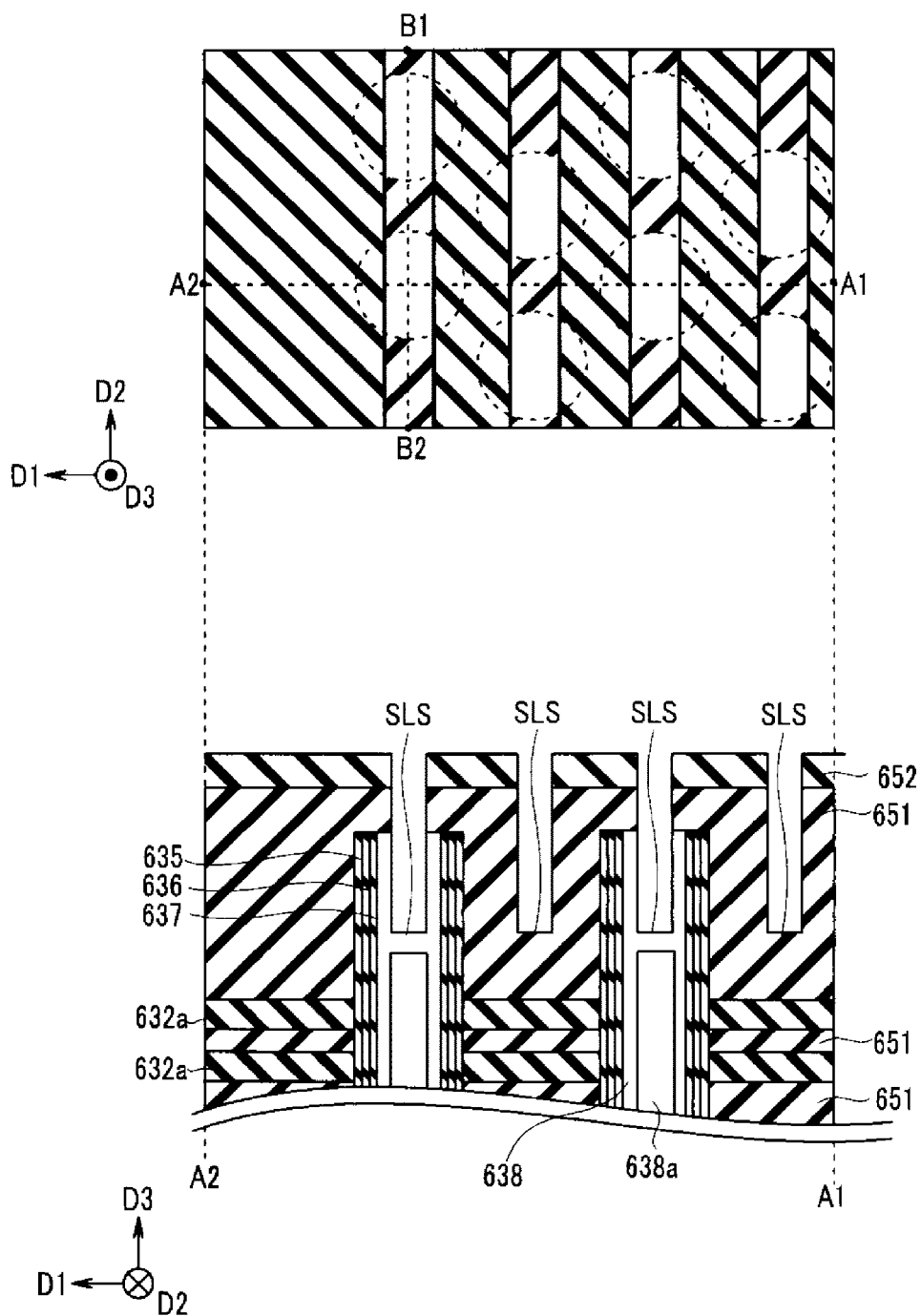
FIG. 8 is a plan view and a cross-sectional view of the memory cell array illustrating an example of a manufacturing process of the memory cell array according to the embodiment.

Subsequently, by performing the anisotropic etching, the insulating layer 654, the underlying layer 653, the etch stopper layer 652, the insulating layer 651, and the semiconductor pillar 638 in a region where the hard mask 655 is not formed are etched to form the slit SLS. Subsequently, the hard mask 655, the insulating layer 654, and the underlying layer 653 are sequentially removed by ashing or wet etching (isotropic etching using a chemical solution or the like). By executing the above procedures, the slit SLS for embedding the wiring layer 631 serving as a gate of the select gate transistor ST1 is formed, and the structure illustrated in FIG. 8 is formed. When a width of the slit SLS (in the D1 direction) is large, a distance between the slit SLS and the tunnel insulating film 637 in the D1 direction is short, so that a depth of a channel region of the select gate transistor ST1 is shallow. In addition, when the width of the slit SLS is large, an area of the semiconductor pillar 638 exposed on an upper portion of the memory pillar MP is small. In this case, a contact area between the semiconductor pillar 638 and the first contact plug 639 is small, which may result in high resistance or disconnection. In order to prevent the high resistance or the disconnection, it is desirable that the width of the slit SLS is approximately the same as a width of the core layer 638a.

Figure 11A:
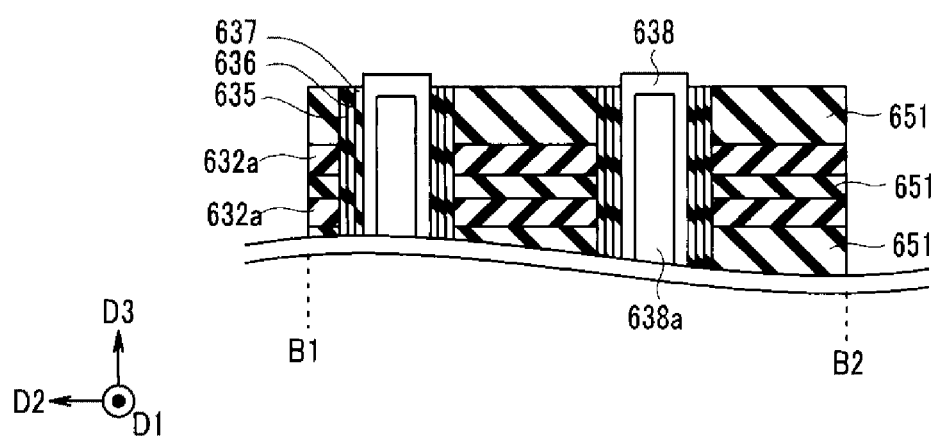
FIGS. 11A-11D are cross-sectional views showing an example of a processed shape of a slit.
Figure 11B:
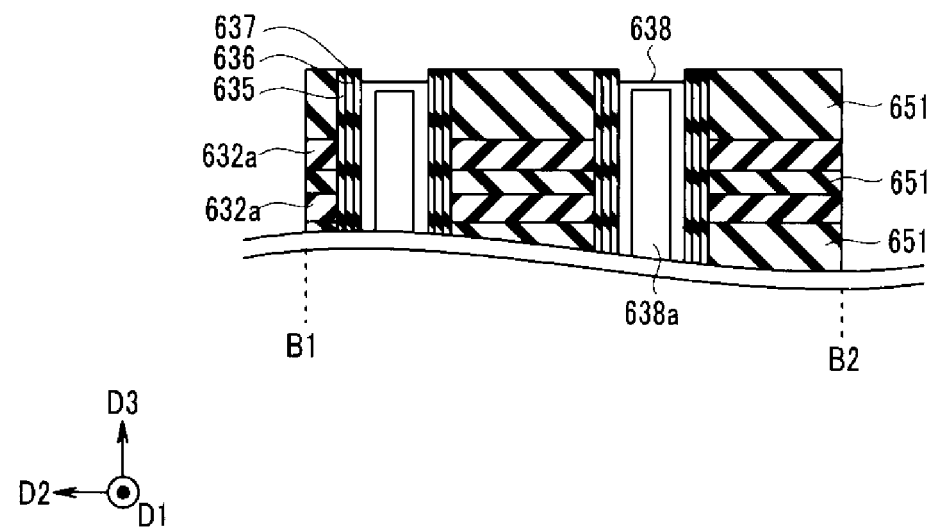
Figure 11C:
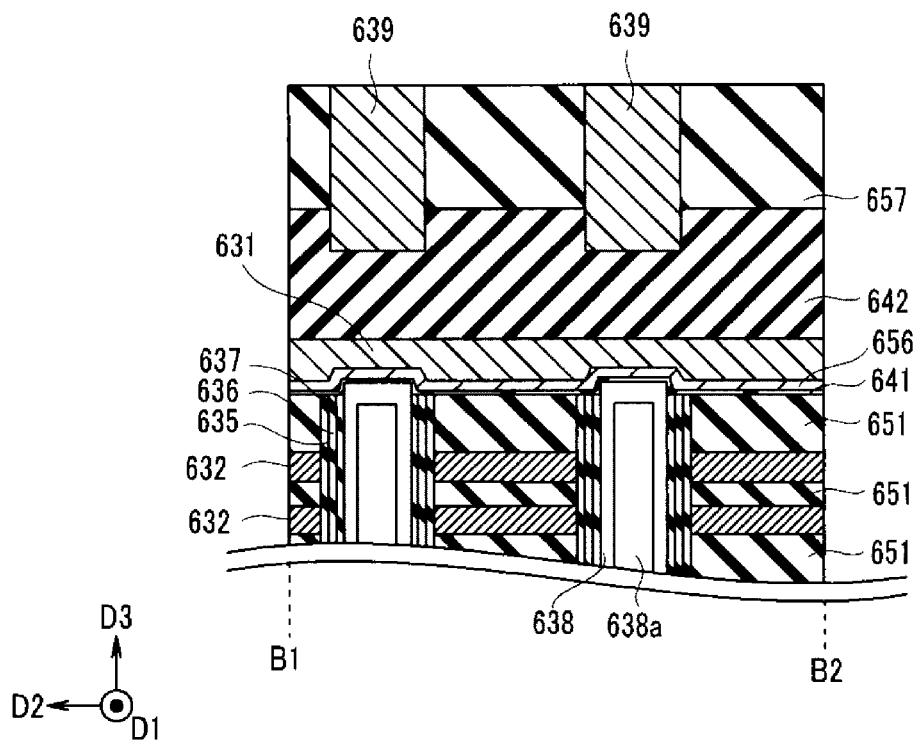
Figure 11D:
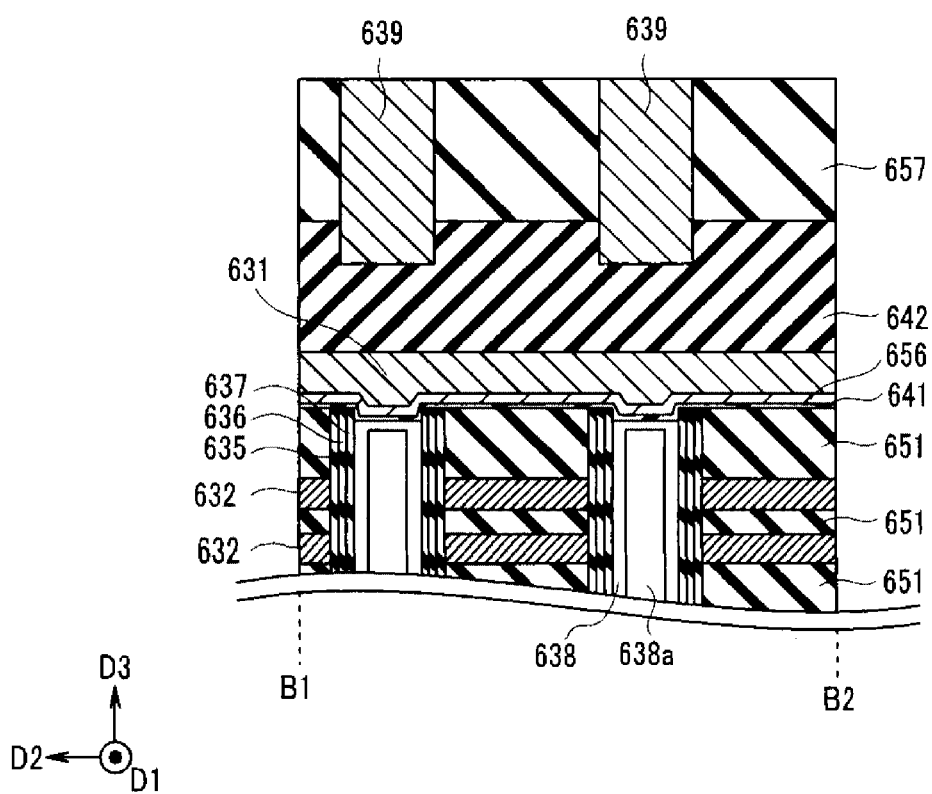

Due to a difference in etching rate between the insulating layer 651 and the semiconductor pillar 638, a height of a bottom surface of the slit SLS may differ between the memory pillar MP and another region. FIGS. 11A to 11D are cross-sectional diagrams each illustrating an example of a processed shape of the slit SLS, and illustrate the cross sections (A1-A2 cross sections) taken along a line B1-B2 of FIG. 8. FIG. 11A illustrates a case where the etching rate of the insulating layer 651 is higher than that of the semiconductor pillar 638, and FIG. 11B illustrates a case where the etching rate of the semiconductor pillar 638 is higher than that of the insulating layer 651. In addition, FIG. 11C illustrates above WL6 and below the first contact plug 639 in the memory cell array 23 manufactured using a structure having a shape illustrated in FIG. 11A. FIG. 11D illustrates above WL6 and below the first contact plug 639 in the memory cell array 23 manufactured using a structure having a shape illustrated in FIG. 11B.

When the difference in the etching rate between the insulating layer 651 and the semiconductor pillar 638 is different, the bottom surface of the slit SLS may have an uneven shape as illustrated in FIGS. 11A and 11B. In the case of the shape illustrated in FIG. 11A, an upper surface of the semiconductor pillar 638 is higher than the upper surface of the insulating layer 651, and in the case of the shape illustrated in FIG. 11B, the upper surface of the semiconductor pillar 638 is lower than the upper surface of the insulating layer 651. Since the wiring layers 631 functioning as the select gate lines SGD are formed along the bottom surface of the slit SLS, when the bottom surface of the slit SLS is uneven, the wiring layers 631 are also uneven in a height direction (D3 direction). In this way, an uneven shape may be formed on a lower surface of the wiring layers 631 in the D3 direction.

Next, a polysilicon exposed on an inner wall of the slit SLS is oxidized by thermal oxidation or the like to form a gate oxide film 641. Further, the gate oxide film 641 may be formed by using a method for depositing a silicon oxide film such as CVD. Then, a conductive layer 656 (for example, titanium nitride) serving as a barrier metal is formed on an entire surface by sputtering, the CVD, or the like, and then a conductor film (for example, tungsten) serving as the wiring layer 631 is embedded in the slit SLS by the CVD. Further, by the wet etching, the conductor film having a height exceeding a predetermined height is etched from the bottom surface of the slit SLS to form the wiring layer 631. The insulating layer 642 is formed on the entire surface of the upper surface by the CVD or the like, and the insulating layer 642 is filled in the slit SLS. The structure illustrated in FIG. 9 is formed by executing the above procedures.

Figure 9:
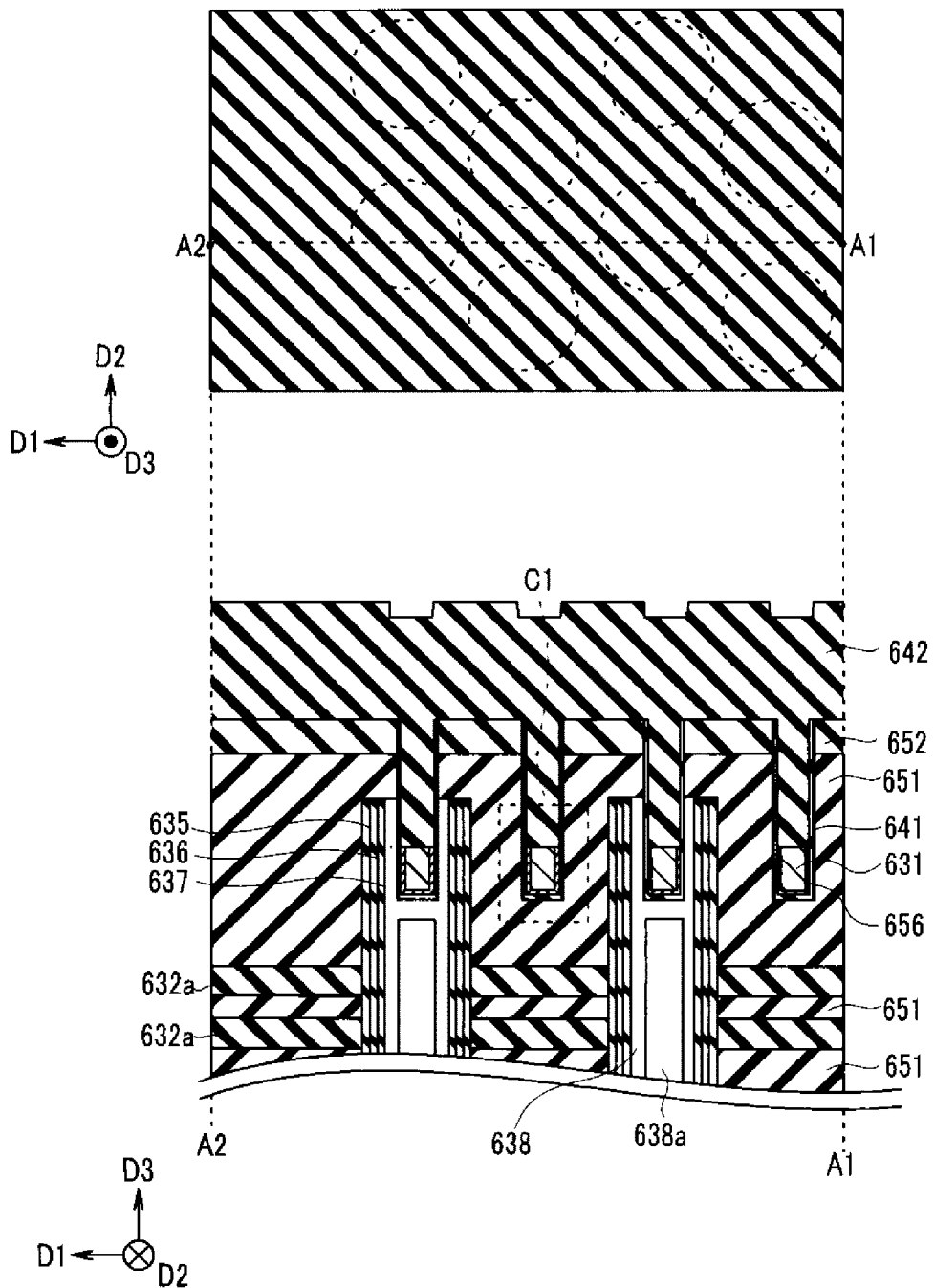
FIG. 9 is a plan view and a cross-sectional view of the memory cell array illustrating an example of a manufacturing process of the memory cell array according to the embodiment.
Figure 12A:
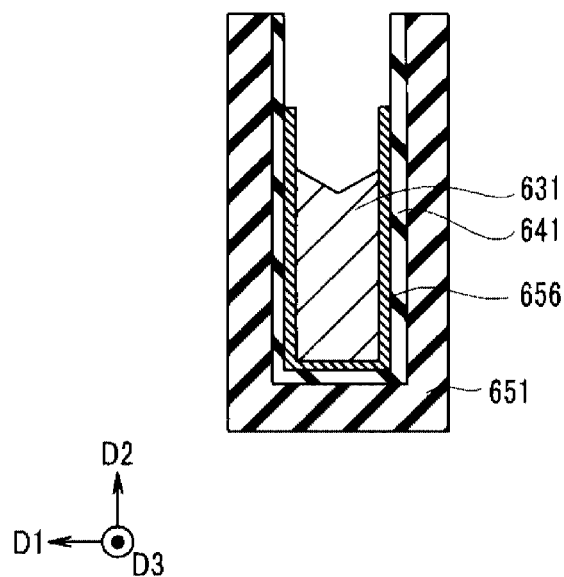
FIGS. 12A-12D are cross-sectional views showing an example of a processed shape of a wiring layer.
Figure 12B:
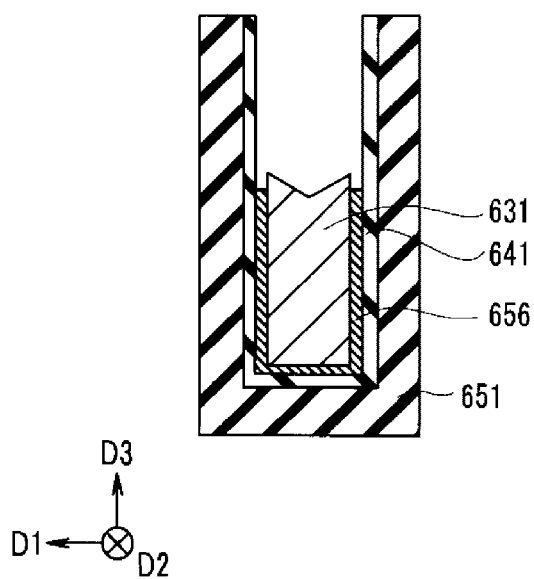
Figure 12C:
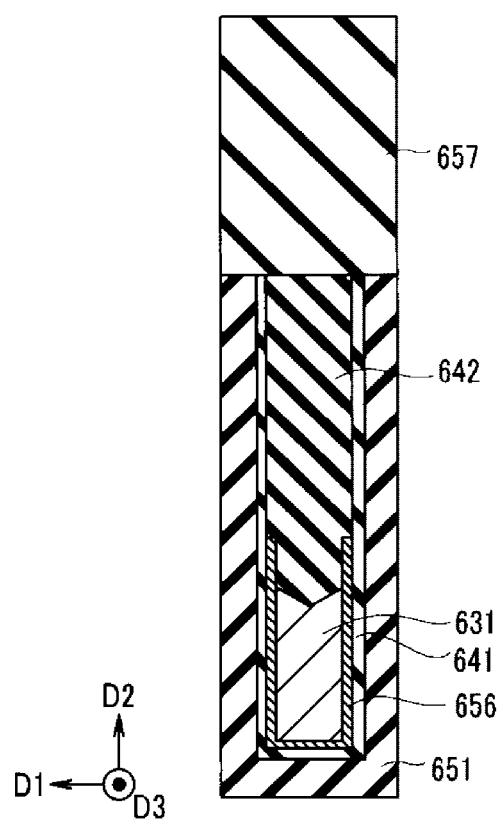
Figure 12D:
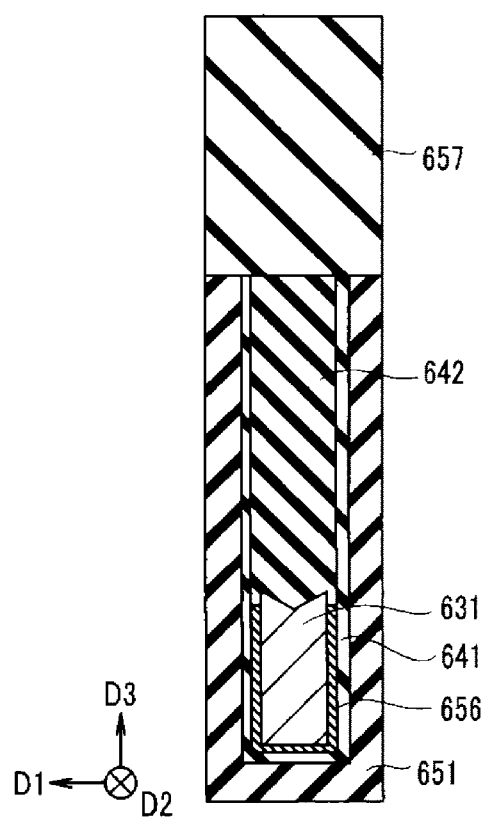

FIGS. 12A to 12D are cross-sectional diagrams each illustrating an example of a processed shape of the wiring layer 631, and illustrate a region Cl surrounded by a broken line in FIG. 9 after wet etching and before embedding of the insulating layer 642. FIG. 12A illustrates a case where an etching rate of the wiring layer 631 is higher than that of the conductive layer 656, and FIG. 12B illustrates a case where an etching rate of the conductive layer 656 is higher than that of the wiring layer 631. FIG. 12C illustrates above the region Cl and below an insulating layer 657 in the memory cell array 23 manufactured using a structure having a shape illustrated in FIG. 12A. FIG. 12D illustrates above the region Cl and below the insulating layer 657 in the memory cell array 23 manufactured using a structure having a shape illustrated in FIG. 12B. Since the width of the slit SLS is narrow, the wiring layer 631 cannot be formed flat when the conductor film serving as the wiring layer 631 is embedded. That is, the wiring layer 631 may have a recess formed in a central portion in a width direction (D1 direction).

In addition, in the case of the shape illustrated in FIG. 12A, an upper surface of the conductive layer 656 is higher than the upper surface of the wiring layer 631, and in the case of the shape illustrated in FIG. 12B, the upper surface of the conductive layer 656 is lower than the upper surface of the wiring layer 631. As described above, a surface of the wiring layer 631 may have a recess, or a height of the wiring layer 631 may be different from that of the conductive layer 656, which is a barrier metal layer.

Subsequently, the insulating layer 642 above the etch stopper layer 652 is removed by polishing by chemical mechanical polishing (CMP). That is, the entire surface of the insulating layer 642 embedded in the slit SLS is flattened by the CMP. After the etch stopper layer 652 is removed by the wet etching or the like, replacement is performed. Specifically, the slits SL1 to SL3 whose bottom surfaces reach the semiconductor substrate 71 are formed at predetermined locations by the anisotropic etching. Next, the sacrificial layers 632a are removed from the slits SL1 to SL3 by the wet etching to form a gap. After embedding the conductor film (for example, tungsten) in the gap, the conductor film formed in the slits SL1 to SL3 and on the uppermost insulating layer 651 is removed to form the wiring layers 632 and 633. Then, an insulating layer 645 is embedded in the slits SL1 to SL3. As a result, the replacement is completed, and the wiring layers 633 serving as the select gate lines SGS and the wiring layers 622 serving as the word lines WL are formed.

Figure 10:
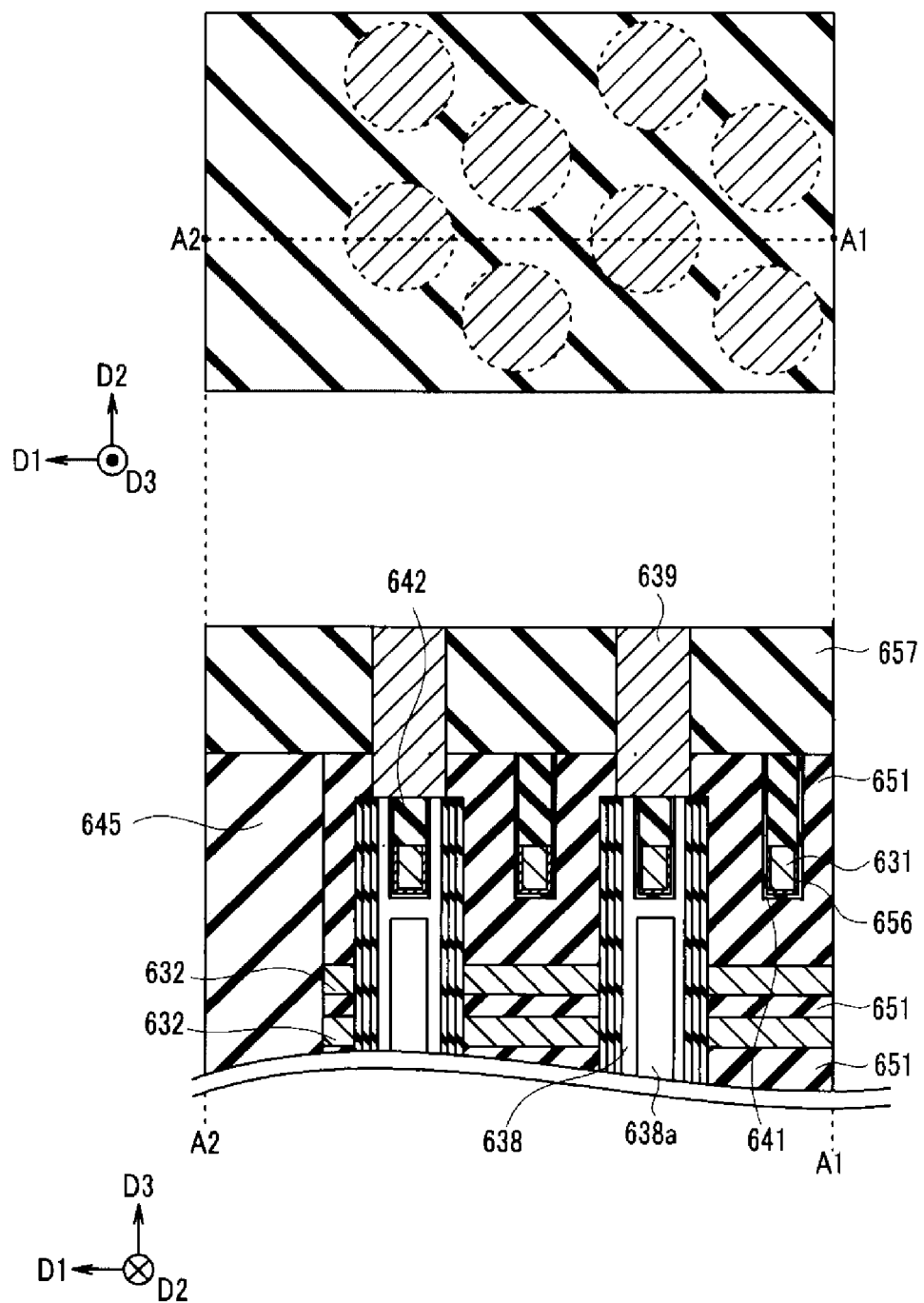
FIG. 10 is a plan view and a cross-sectional view of the memory cell array illustrating an example of a manufacturing process of the memory cell array according to the embodiment.

Subsequently, the first contact plug 639 is formed. First, the insulating layer 657 is deposited on the entire surface of the upper surface by the CVD or the like. Subsequently, a hard mask is formed on an upper surface of the insulating layer 657. Then, the hard mask of a first contact plug 639 forming region is removed. That is, the hard mask is patterned such that the insulating layer 657 is exposed only in the first contact plug 639 forming region. Subsequently, the insulating layer 657 and the insulating layer 651 in the region where the hard mask is not formed are etched to the upper surface of the memory pillar MP by the anisotropic etching to form a contact hole. After removing the hard mask by the ashing or the wet etching, the conductor film (for example, tungsten) is embedded in the contact plug by the CVD or the like. Finally, the conductor film formed on the uppermost insulating layer 657 is removed to form the first contact plug 639. The structure illustrated in FIG. 10 is formed by executing the above procedures.

Subsequently, after the insulating layer is formed on the entire surface, the second contact plug 640 made of the conductor film is formed at a predetermined position on the first contact plug 639, and the wiring layer 643 is formed on the upper layer of the second contact plug 640 to form the structure illustrated in FIG. 5A.

As described above, according to the present embodiment, the select gate line SGD penetrates the semiconductor pillar 638 of the memory pillar MP. Specifically, the select gate line SGD extends in a direction (D2 direction) orthogonal to the bit line BL, and includes a plurality of wirings arranged in the D1 direction. The individual select gate lines SGD penetrate the memory pillars MP having the same position in the D1 direction in the D2 direction.

For example, similarly to the word line WL and the select gate line SGS, the select gate line SGD may surround the cylindrical semiconductor pillar 638. In this case, the width of the select gate line SGD in the D1 direction is larger than the width of the semiconductor pillar 638 of the memory pillar MP in the D1 direction. Unlike the select gate line SGS and the word line WL, the select gate lines SGD need to be separated for each of the string units SU, and a plurality of select gate lines SGD are arranged on one word line WL. Therefore, it is necessary to separate the adjacent select gate lines SGD by a certain distance, and the region of the memory cell array 23 may increase in the D1 direction, for example.

In contrast, according to the configuration of the present embodiment, since the select gate line SGD penetrates the semiconductor pillar 638 of the memory pillar MP, the width of the select gate line SGD in the D1 direction is smaller than the width of the semiconductor pillar 638 of the memory pillar MP in the D1 direction. Therefore, the separation distance between the adjacent select gate lines SGD is sufficiently maintained, and it is possible to prevent an increase in a chip area in the D1 direction, for example.

Further, according to the present embodiment, the channel of the select gate transistor ST1 is formed on the semiconductor pillar 638 of the memory pillar MP. For example, when the select gate transistor ST2 and the memory transistor MT are formed in the memory pillar MP, then the select gate transistor ST1 separated in advance for each of the string units SU is formed above the memory pillar MP, and a channel forming region of the select gate transistor ST1 and the semiconductor pillar 638 of the memory pillar are connected in contact with each other, there is a possibility that resistance increases in a contact connection portion.

In contrast, according to the configuration of the present embodiment, the channels of the select gate transistor ST2, the memory transistor MT, and the select gate transistor ST1 are formed in the semiconductor pillar 638. Therefore, since there is no portion in which different semiconductor layers are brought into contact with and connected to each other in a current path, the increase in the resistance can be prevented.

In addition, according to the present embodiment, the select gate line SGD of the NAND strings in the same string unit SU is connected to the same voltage supply line and is configured to be supplied with the same voltage. That is, according to the present embodiment, the number of rows of the memory pillars MP in one string unit SU can be optionally set, and a degree of freedom of design is improved.

The semiconductor storage device of the present embodiment can be applied regardless of the arrangement structure of the memory cell array 23 and peripheral circuits (elements other than the memory cell array 23 constituting the non-volatile memory 2, such as the input and output circuit 22 and the logic control circuit 21). For example, the memory cell array 23 and the peripheral circuits may be arranged side by side on the semiconductor substrate 71, or the peripheral circuits may be formed on the semiconductor substrate 71 and the memory cell array 23 may be formed above the peripheral circuits. Further, the memory cell array 23 and the peripheral circuits may be formed of separate chips and then bonded together.

Figure 13:
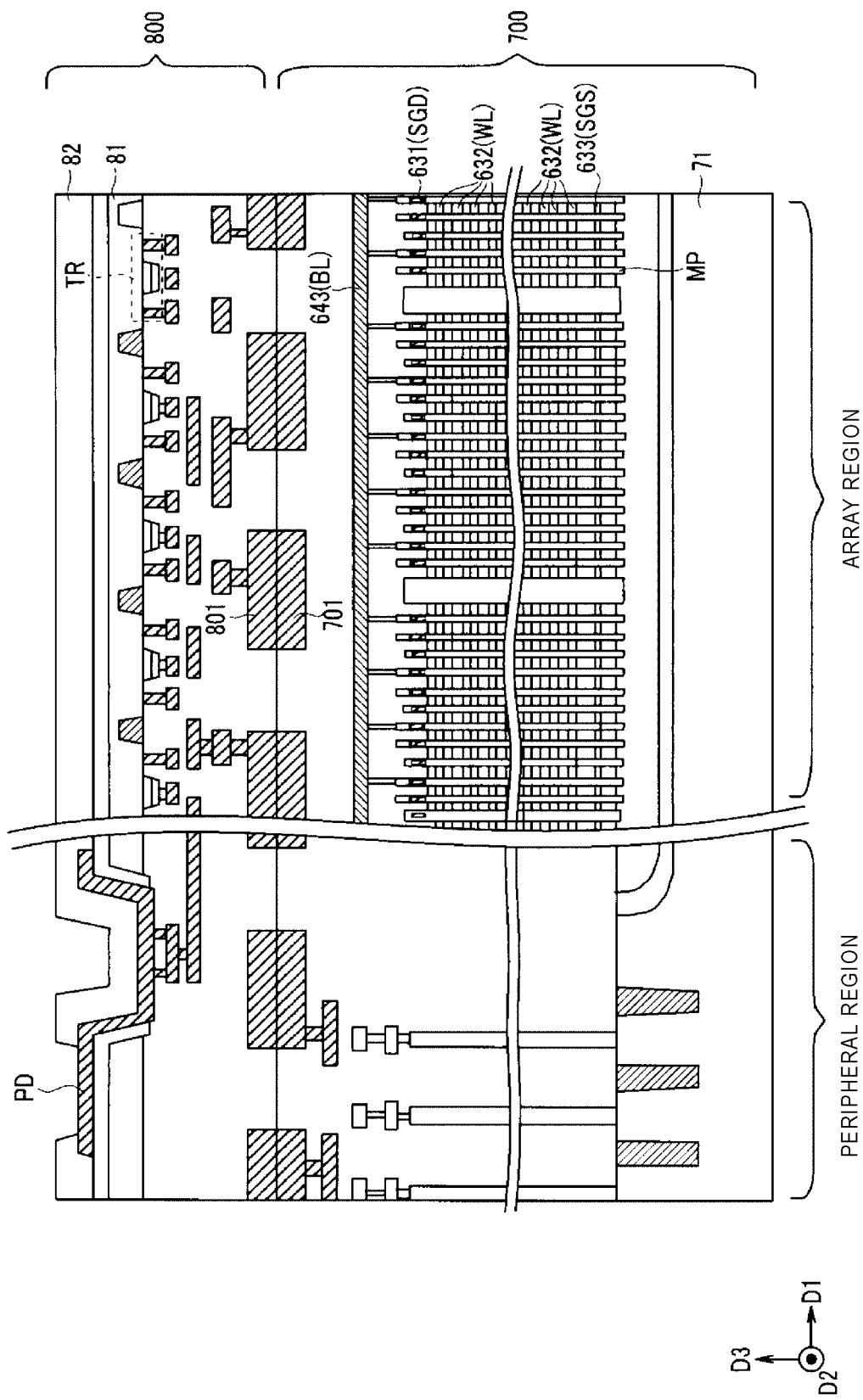
FIG. 13 is a schematic cross-sectional view showing a structure of the semiconductor storage device formed by stacking an array chip and a circuit chip.

FIG. 13 is a schematic cross-sectional diagram showing the structure of the semiconductor storage device formed by bonding an array chip and a circuit chip. As illustrated in FIG. 13, the semiconductor storage device has a configuration in which an array chip 700 and a circuit chip 800 are bonded together. The array chip 700 is formed with the memory cell array 23 and various wirings for connecting the memory cell array 23 and the circuit chip 800. The array chip 700 includes an array region and a peripheral region, and the memory cell array 23 is formed in the array region. The memory cell array of the structure illustrated in FIG. 5A can be used as the memory cell array 23 formed in the array region. That is, the wiring layer 633 serving as the select gate line SGS and the wiring layer 632 serving as the word line WL are formed in a flat plate shape parallel to the surface of the semiconductor substrate 71, and the plurality of wiring layers 631 serving as the select gate lines SGD extend in a direction (D2 direction) orthogonal to a direction (D1 direction) in which the wiring layer 643 serving as the bit line BL extends, and are arranged at a predetermined interval in the D1 direction. Each of the wiring layers 631 is formed above the wiring layer 632 so as to penetrate the memory pillar MP. The wiring layer 643 is electrically connected to any of bonding electrodes 701 via the contact plug or another wiring layer. The bonding electrodes 701 are used for connecting to the circuit chip 800.

The circuit chip 800 is formed with the logic control circuit 21, the sense amplifier 24, the row decoder 25, the register 26, the sequencer 27, the voltage generation circuit 28, and the like. A gate electrode, a source, and a drain of each of a plurality of transistors TR formed on a semiconductor substrate 81 are electrically connected to any of bonding electrodes 801 via the contact plug and a plurality of wiring layers. The bonding electrodes 801 are electrically connected to the facing bonding electrodes 701.

A plurality of electrode pads PD are provided on an upper surface of the circuit chip 800 in the D3 direction. The electrode pads PD are used for connecting the semiconductor storage device 1 and an external device. Each of the electrode pads PD is electrically connected to any of the bonding electrodes 801 via the contact plug or the wiring layer. An insulating layer 82 that functions as a passivation film is formed on an upper surface of the circuit chip 800 in the D3 direction. The insulating layer 82 is provided with openings corresponding to the electrode pads PD. In the semiconductor storage device having such a bonding structure, it is possible to prevent the increase in the chip area and prevent an increase in channel resistance of the NAND string by applying the above structure to the select gate line SGD of the NAND string.

Figure 14:
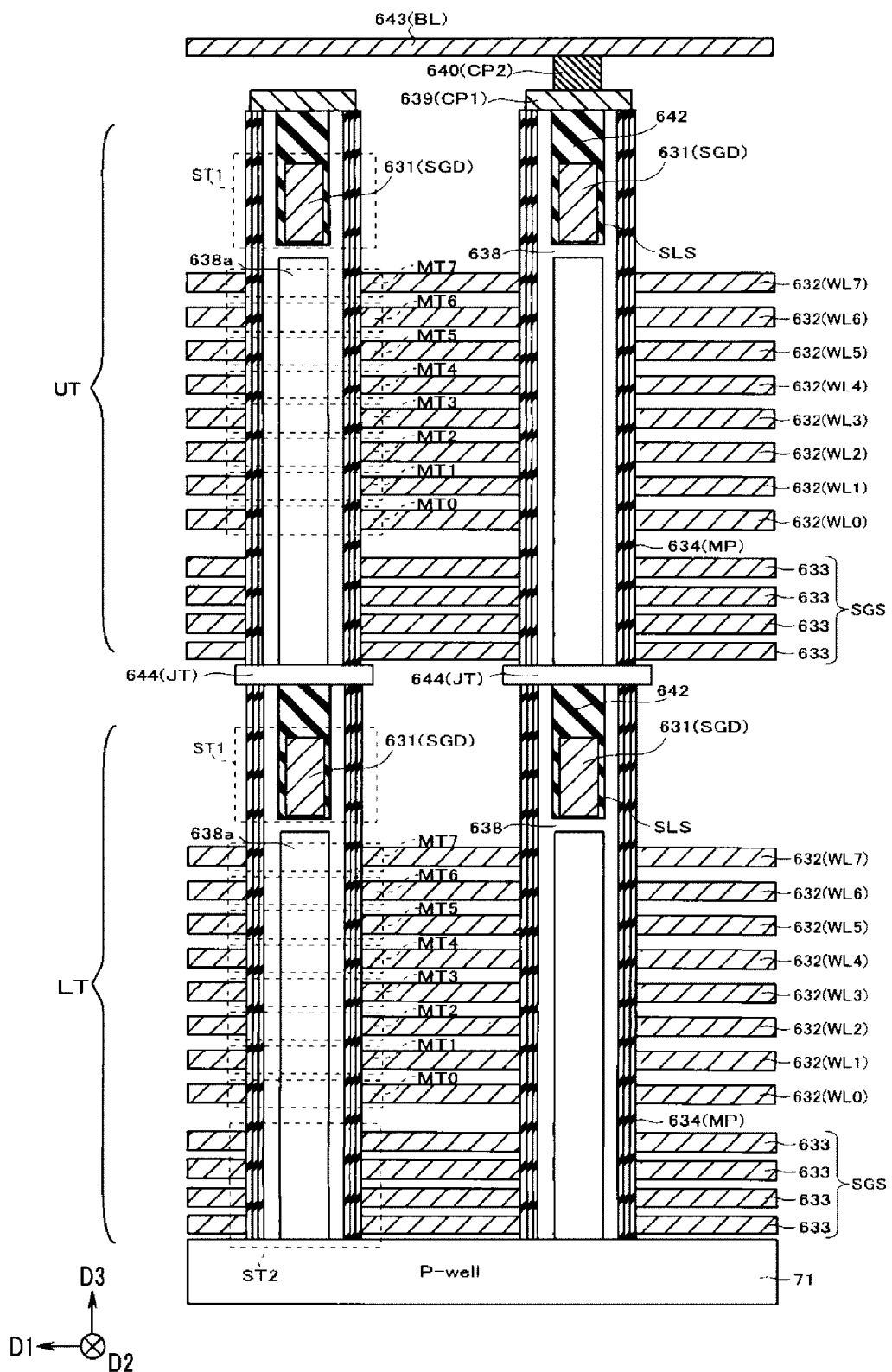
FIG. 14 is a cross-sectional view of a partial region of a memory cell array including a memory string having a two-layer structure.

Further, the semiconductor storage device according to the embodiment is also applicable to a case where the NAND string NS is formed in a two-layer structure, as illustrated in FIG. 14. FIG. 14 is a cross-sectional diagram of a partial region of a memory cell array including the two-layer structure NAND string.

The three-dimensional NAND memory cell array as illustrated in FIG. 5A can be formed by stacking the wiring layer 633 serving as the select gate line SGS and the plurality of wiring layers 632 serving as the word lines, then collectively processing the memory pillars 634, and processing the wiring layers 631 serving as the select gate lines SGD so as to penetrate the memory pillars 634. However, for example, the three-dimensional NAND memory cell array having a large number of layers has a high aspect ratio when processing the memory pillars 634, and thus processing may be difficult. Therefore, a process of stacking the wiring layers 632 to form the memory pillars 634 may be performed in a plurality of times.

Here, as an example, the two-layer structure NAND string NS formed by stacking the wiring layers 632 and processing the memory pillars 634 twice will be described. The two-layer structure NAND string NS has a structure in which a conductive layer 644 called a joint portion JT is interposed between a lower tier LT and an upper tier UT. That is, the lower tier LT is formed by stacking the wiring layer 633 serving as the select gate line SGS and the plurality of wiring layers 632 serving as some word lines, then processing the memory pillars 634, and processing the wiring layers 631 serving as the select gate lines SGD for the lower tier so as to penetrate the memory pillars 634. Thereafter, the upper tier UT is formed by stacking the conductive layer 644 serving as the joint portion JT, stacking the plurality of wiring layers 633 serving as the remaining word lines, then processing the memory pillars 634, and processing the wiring layers 631 serving as the select gate lines SGD for the upper tier so as to penetrate the memory pillars 634. As described above, the above structure may be applied to the select gate lines SGD in each layer of the two-layer structure NAND string NS. Further, the lower tier LT and the upper tier UT may be directly connected without interposing the conductive layer 644 which is the joint portion JT.

While certain embodiments have been described, these embodiments have been presented by way of example only, and are not intended to limit the scope of the disclosure. The novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a plurality of first wirings stacked in a first direction;
   a memory pillar penetrating the plurality of first wirings in the first direction;
   a semiconductor layer provided in the memory pillar and extending in the first direction;
   a second wiring above the plurality of first wirings in the first direction, extending in a second direction crossing the first direction, and penetrating the semiconductor layer;
   a third wiring above the memory pillar extending in a third direction crossing the first and second directions;
   a first contact that is in direct contact with the semiconductor layer of the memory pillar; and
   a second contact that is in direct contact with the first contact and the third wiring.

2. The semiconductor storage device according to claim 1, further comprising:
   a plurality of the memory pillars arranged in the second direction, wherein
   the second wiring penetrates the plurality of memory pillars.

3. The semiconductor storage device according to claim 1, wherein
   a cross section of the second wiring taken orthogonal to the second direction is longer in the first direction than in a third direction orthogonal to the first direction and the second direction.

4. The semiconductor storage device according to claim 1, further comprising:
   a plurality of wiring groups each including a plurality of the second wirings, wherein
   the same voltage is supplied to the second wirings belonging to the same wiring group.

5. The semiconductor storage device according to claim 1, wherein a portion of the second wiring that penetrates the semiconductor layer is surrounded by the semiconductor layer.

6. The semiconductor storage device according to claim 5, wherein the memory pillar includes an insulating core layer extending in the first direction below the second wiring, the core layer being surrounded by the semiconductor layer.

7. The semiconductor storage device according to claim 6, wherein a width of the portion of the second wiring that penetrates the semiconductor layer in a third direction crossing the first and second directions is about equal to a diameter of the core layer.

8. The semiconductor storage device according to claim 7, wherein a first portion of the second wiring that is positioned directly above the core layer in the first direction has a smaller thickness in the first direction than a second portion of the second wiring that is not positioned directly above the memory pillar.

9. The semiconductor storage device according to claim 7, wherein a first portion of the second wiring that is positioned directly above the core layer in the first direction has a larger thickness in the first direction than a second portion of the second wiring that is not positioned directly above the memory pillar.

10. The semiconductor storage device according to claim 1, further comprising:
    an insulating layer between the first contact and the portion of the second wiring that penetrates the semiconductor layer in the first direction, and surrounded by the semiconductor layer.

11. The semiconductor storage device according to claim 10, further comprising:
    a gate insulating film between the second wiring and the semiconductor layer; and
    a barrier metal layer between the gate insulating film and the second wiring,
    wherein the insulating layer contacts a top surface of the second wiring and top and side surfaces of the barrier metal layer.

12. The semiconductor storage device according to claim 10, further comprising:
    a gate insulating film between the second wiring and the semiconductor layer; and
    a barrier metal layer between the gate insulating film and the second wiring,
    wherein the insulating layer contacts a top surface of the barrier metal layer and top and side surfaces of the second wiring.

* * * * *